US006295009B1

(12) United States Patent
Goto

(10) Patent No.: US 6,295,009 B1
(45) Date of Patent: Sep. 25, 2001

(54) AUDIO SIGNAL ENCODING APPARATUS AND METHOD AND DECODING APPARATUS AND METHOD WHICH ELIMINATE BIT ALLOCATION INFORMATION FROM THE ENCODED DATA STREAM TO THEREBY ENABLE REDUCTION OF ENCODING/DECODING DELAY TIMES WITHOUT INCREASING THE BIT RATE

(75) Inventor: Michiyo Goto, Sagamihara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/394,511

(22) Filed: Sep. 13, 1999

(30) Foreign Application Priority Data

Sep. 17, 1998 (JP) ........................................ 10-280479

(51) Int. Cl.[7] ........................................ H03M 7/00
(52) U.S. Cl. ........................................ 341/50; 704/229
(58) Field of Search ........................ 341/50, 51; 704/229

(56) References Cited

U.S. PATENT DOCUMENTS 5,581,653 12/1996 Todd ........................................ 395/238
5,758,315 * 5/1998 Mori ........................................ 704/229

OTHER PUBLICATIONS

Caini C et al: "High quality audio perceptual subband coder with backward dynamic bit allocation" Proceedings of ICICS, 1997 International Conference on Information, Commmunications and Signal Processing. Theme: Trends in Information Systems Engineering and Wireless Multimedia Communications (Cat. No. 97TH8237), Proceedings of 1st International Con, pp. 762–766 vol. 2, XP002138020, 1997 New York, NY, USA, IEEE, USA ISBN: 0–7803–3676–3.

Information technology—Coding of moving pictures and associated audio for digital storage media at up to about 1,5 Mbit/s—Part 3; Audio; Intrnational Standard; ISO/IEC 11172–3; Aug. 1, 1993;pp., ii–vi,66–81.

* cited by examiner

*Primary Examiner*—Peguy JeanPierre
(74) *Attorney, Agent, or Firm*—Louis Woo

(57) ABSTRACT

In a method and apparatus for encoding a digital audio signal to transmit the signal as an encoded bitstream formatted as a series of frames, and a corresponding method and apparatus for decoding the encoded bitstream, with audio data being conveyed in each frame as a set of quantized samples which have each been quantized using a calculated scale factor and a number of allocated bits which is specified by bit allocation information that is calculated based on the scale factors, the bit allocation information generated in the encoding process is omitted from each frame of the encoded bitstream, and is again generated in the decoding process by using the received decoded scale factors. The number of frame bits which can be allocated to quantizing the audio data is thereby substantially increased by comparison with the prior art, enabling the frame length to be made shorter and the overall encoding/decoding delay time to be significantly reduced by comparison with prior art methods, without lowering of audio reproduction quality and while still utilizing a low bit rate for the encoded data.

10 Claims, 14 Drawing Sheets

80

AUDIO SIGNAL ENCODING APPARATUS AND METHOD AND DECODING APPARATUS AND METHOD WHICH ELIMINATE BIT ALLOCATION INFORMATION FROM THE ENCODED DATA STREAM TO THEREBY ENABLE REDUCTION OF ENCODING/DECODING DELAY TIMES WITHOUT INCREASING THE BIT RATE

FIELD OF THE INVENTION

The present invention relates to an audio signal encoding method and apparatus and an audio signal decoding method and apparatus whereby reduced amounts of encoding and decoding delay can be achieved.

In recent years there has been considerable research and development concerning digital audio signal encoding methods, and the MPEG-1 method of audio encoding (specified as the international standard ISO/IEC 11172-3) has become widely utilized, since it enables high-quality audio reproduction to be achieved even when the encoded data are generated at a low bit rate. FIGS. 13 and 14 illustrate the basic features of an audio encoding/decoding system which conforms to the MPEG-1 standard. FIG. 13 is a block diagram of the basic MPEG-1 audio encoder, while FIG. 14 is a block diagram of the corresponding decoder. There are three different models for practical encoding/decoding systems under the MPEG-1 audio standard, having successively increasing levels of complexity, which are respectively referred to as Layer 1, Layer 2, and Layer 3. FIGS. 15, 16 and 17 respectively illustrate the frame formats of MPEG-1 audio Layer 1 encoding, Layer 2 encoding and Layer 3 encoding. The degree of coding efficiency increases as the layer numbers go higher, i.e., Layer 3 encoding enables data to be encoded and transmitted at a lower bit rate, without loss of reproduction quality, than does Layer 2 encoding, and Layer 2 encoding is similarly superior to Layer 1 encoding. However the amounts of encoding and decoding delay times are increased in accordance with increases in the layer number.

In FIG. 13, the MPEG-1 audio encoder apparatus is made up of a mapping section 112, a psychoacoustic model section 113, a quantization and coding section 114 and a frame packing section 115. The mapping section 112 of this encoder is a sub-band filter, which decomposes each of respective sets of successive PCM digital audio data sample into a plurality of sets of frequency-domain sub-band samples, with these sets of sub-band samples corresponding to respective ones of a fixed plurality of sub-bands. With MPEG-1 audio Layer 2 encoding, each set of 32 input digital audio samples is mapped onto a corresponding set of 32 sub-band samples, and the contents of twelve of these sets of 32 input audio samples (i.e., a total of 384 successive audio data samples) are transferred in the form of quantized and encoded sub-band samples by each frame of an encoded bit stream, as described in Annex C of ISO/IEC 11172-3. Thinning-out of data samples occurs with this transform from the time domain to the frequency domain, since for each frame, there will be some sub-bands for which the samples are of insufficient magnitude to be quantized and encoded.

In encoding each frame, the psychoacoustic model section 113 derives respective mask values for each of the sub-bands, with each mask value expressing an audio signal level which must be exceeded by any signal component, such as quantization noise, in order for that signal component to become audible to a person hearing the final reproduced audio signal. In the case of MPEG-1 audio Layer 1 encoding, the quantization and coding section 114 utilizes the mask values for the respective sub-bands and the signal-to-noise ratios of the sub-band samples of a sub-band, to derive corresponding mask-to-noise ratios for each of the sub-bands, and to accordingly generate bit allocation information which specifies the respective numbers of bits to be used to quantize each of the sub-band samples of a sub-band (with zero bits being allocated in the case of each sub-band for which the samples are of insufficient magnitude for encoding).

The bit allocation information is derived such that the values of mask-to-noise ratio for each of the sub-bands, after quantization, are made substantially balanced, i.e., by assigning a relatively large number of quantization bits to a sub-band having a relatively small scale factor and assigning smaller numbers of quantization bits to the sub-bands having relatively large values of scale factor. With MPEG-1 audio Layer 1 encoding, this is achieved by a simple iterative algorithm for distributing the bits that are available within a frame for quantizing the samples, which is described in Annex C of ISO/IEC 11172-3.

The frame packing section 115 receives the output data generated for each frame by the quantization and coding section 114, and also any ancillary data which may be required to be included in the frame, generates the frame header and error check data, and assembles these as one frame, in the requisite bitstream format.

The specific manner of operation of the quantization and coding section 114, and the frame format that is generated by the frame packing section 115, are determined in accordance with whether the Layer 1, Layer 2, or Layer 3 model is utilized.

The MPEG-1 decoder 121 shown in FIG. 14 is formed of a frame unpacking section 122, a reconstruction section 123 and an inverse mapping section 124. The operation of the decoder 121 is as follows. As the series of bits constituting one frame are successively supplied to the frame unpacking section 122, the respective data portions of the frame, described above, are separated by the frame unpacking section 122, with the ancillary data being output from the decoder and the remaining data of the frame being supplied to the reconstruction section 123. The reconstruction section 123 dequantizates the sub-band samples of the respective sub-bands, and supplies the resultant samples to the inverse mapping section 124. The inverse mapping section 124 executes an inverse mapping operation to that of the mapping section 112 of the encoder, i.e. to convert the dequantized sub-band samples conveyed by the frame to a corresponding set of PCM digital audio data samples. Assuming that 384 audio data samples are encoded for one frame, as described above, the inverse mapping section 124 will correspondingly convert the sub-band samples conveyed by each frame to 384 PCM audio data samples, i.e., the sample rate of the output data from the inverse mapping section 124 of the decoder 121 is identical to the sample rate of the audio data which are input to the encoder 111. This is either 32 kHz, 44.1 kHz, or 48 kHz.

As stated hereinabove, the higher the layer number, of the Layer 1, Layer 2 and Layer 3 MPEG-1 bitstream formats, the greater is the coding efficiency. Hence, high-quality audio reproduction can be achieved from the decoded PCM audio data even with a low bit rate for the MPEG-1 encoded data, if the Layer 2, or especially the Layer 3 format is utilized. FIG. 15 illustrates the MPEG-1 bitstream format in the case of Layer 1. As shown, each frame is formed of a header 131, followed by an error check portion 132, an audio data portion 133, and an ancillary data portion 134. The audio data portion 133 is made up of a bit allocation information portion containing respective bit allocation information for each of the sub-bands, a scale factor portion containing respective scale factors for each of the sub-bands, and a data sample portion containing the quantized encoded sub-band samples.

FIG. 16 illustrates the MPEG-1 bitstream format in the case of Layer 2. As shown, this differs from the bitstream format of Layer 1 described above only in that the audio data portion further includes scale factor selection information.

FIG. 17 illustrates the MPEG-1 bitstream format in the case of Layer 3. As shown, this differs from the bitstream format of Layer 1 described above in that the audio data portion 153 is formed of an "additional information" portion, and a "main information" portion. In this case the sub-band samples have been subjected to Huffman encoding, and the main data is made up of bits which express the scale factors, the Huffman encoded data, and the ancillary data. In the actual bitstream which is generated by the encoding, with the Layer 3 MPEG-1 audio encoding, the "main information" portion of a frame is located at a time-axis position which precedes the frame header. That actual position of the start of the "main information" of the frame is specified by the "additional information" of the frame. In the case of single-channel audio, the "additional information" portion occupies 17 bytes, while in the case of two-channel audio it occupies 32 bytes.

With such a prior art audio signal encoding method, the frame length (i.e., the number of samples of the original digital audio signal which are encoded and conveyed by one frame) is 384 samples in the case of the Layer 1 format, and is 1152 samples in the case of each of the Layer 2 and Layer 3 formats. Thus, assuming an audio data sampling frequency of 48 kHz, the frame length is equivalent to 8 ms in the case of the Layer 1 format, and is 20 ms in the case of each of the Layer 2 and Layer 3 formats. If the audio data sampling frequency is 32 kHz, the frame length is equivalent to 12 ms in the case of the Layer 1 format, and is 36 ms in the case of each of the Layer 2 and Layer 3 formats.

When real-time processing to implement the prior art encoding and decoding methods described above is performed, the total amount of time delay required to execute encoding and then decoding is four times the frame length. This is because, to encode the audio data in units of frames, the audio data sample of one frame are successively accumulated in a buffer while the audio data sample for the preceding frame, i.e., which are currently held in a buffer, are being read out and encoded. It is possible to reduce the time required to encode the data for one frame, by increasing the processing speed. However, irrespective of the degree to which that processing speed is increased, it is still necessary to wait until all of the audio data sample for a frame have been accumulated in a buffer before starting encoding processing of that set of samples. Hence, the time required to complete encoding of a frame is twice the frame length.

Similarly during decoding, the audio data sample conveyed by one frame are successively accumulated in a buffer, with the decoded audio data sample for a frame being successively read out from buffer (at the sampling frequency) while the samples for the succeeding frame are being decoded. The time required to accumulate the audio data sample of one frame in a buffer could be decreased by increasing the bit rate at which encoded bitstream is transmitted, and the speed of the decoding processing. However it is still necessary to output the audio data samples of each frame in real time, so that the time required to decode one frame is twice the frame length.

Thus, the total time required to execute encoding and decoding of one frame, i.e. the total delay time, is four times the frame length. If for example the sampling frequency of the audio data is 48 kHz, then in the case of the MPEG-1 Layer 1 format (in which the frame length is 8 ms) the delay time becomes 32 ms, while in the case of the MPEG-1 Layer 2 and Layer 3 formats (for each of which the frame length is 24 ms) the delay time becomes 96 ms. In addition, further delays are introduced by the operation of the sub-band filter of the MPEG-1 encoding, which decomposes the audio data into sub-band samples as described above, and by the corresponding sub-band filter of the MPEG-1 decoding which executes the inverse function. The delay time of such a filter is determined by the number of taps, and in the case of MPEG-1 audio encoding and decoding each sub-band filter has 512 taps. Such a filter introduces a delay of 10.67 ms, when the audio data sampling frequency is 48 kHz. Thus, when the sampling frequency is 48 kHz, the total amount of encoding and decoding delay becomes approximately 43 ms in the case of the Layer 1 format, and becomes approximately 107 ms in the case of the Layer 2 and Layer 3 formats.

The human auditory senses can detect delays which are of the order of 10 to 100 ms or higher, so that such delay times may be a serious disadvantage in certain applications of and MPEG-1 audio encoding and decoding system. For example, such an encoding method might be applied to an audio system in which sound received by a microphone is encoded and transmitted to a receiver, to be decoded therein. If a person is speaking or singing into the microphone of such an audio system, then the aforementioned total delay time will result in a discrepancy between the movement of the mouth of that person and the resultant sound which are emitted from the loudspeaker. This will create an unnatural impression, to a listening audience. Similarly, such an encoding system might be used in an audio system where a loudspeaker is mounted on a stage, such that a person might hear his or her voice emitted from the loudspeaker, while using a microphone connected to the system, In such a case if there is a long amount of delay caused by encoding and decoding the audio signal, there will be a significant time difference between the sound which reaches that person's ear directly and the sound which is emitted from the loudspeaker. This may result in difficulty in speaking or singing.

In order to reduce the delay time of an MPEG-1 audio encoding/decoding system, it is necessary to decrease the sub-band filter delay and/or the frame length. However if the frame length is reduced, the proportion of each frame which is occupied by information other than audio samples, i.e., the header, and the bit allocation information, etc., will be increased. With the MPEG-1 Layer 1 format, with a bit rate for the encoded data of 128 kbit/s, the total number of bits constituting one frame is 1024. Of these, 32 bits are assigned to the header, 128 bits are assigned to the bit allocation information, and 864 bits are left available to be allocated to the scale factors and the audio data sample. In that case, if the frame length were to be reduced to ¼ of the standard length, i.e. so that the scale factors and audio samples (sub-band samples) of a frame express 96 samples of the original audio signal, then the total number of bits constituting one frame would become 256, with 32 of these bits being assigned to the header, 128 bits assigned to the bit allocation information, and only 96 bits being assigned to the scale factors and audio samples. Thus whereas with the original frame length, an average of 2.25 bits are available for each of the encoded scale factors and quantized encoded audio samples, only 1 bit is available for each of these, if the frame length is reduced to ¼ of its original value.

Thus, if the frame length is shortened, this results in a reduction of the number of bits available for assignment to the actual encoded audio data, and hence the audio reproduction quality will deteriorate.

SUMMARY OF THE INVENTION

It is an objective of the present invention to overcome the disadvantages of a prior art type of digital audio signal encoding and decoding, by providing a method and apparatus for encoding and decoding a digital audio signal, with the encoded digital audio signal being transmitted as a bitstream which is formatted as a sequence of frames, whereby the frame length (as defined hereinabove) can be made shorter while leaving the bit rate of the encoded bitstream unchanged, and without deterioration of audio reproduction quality. The invention thus enables a reduction in the overall encoding and decoding delay time while still utilizing a low bit rate, yet avoids the prior art disadvantage of a lowering of audio reproduction quality due to reduction of the number of frame bits that are available for encoding the audio data conveyed by each frame.

The present invention basically achieves the above objective by eliminating the bit allocation information of each frame from the encoded data stream, i.e., eliminating the information which in the prior art must be available to a decoding apparatus for determining the respective numbers of bits that have been allocated to quantizing each of the data samples conveyed in a frame. The bit allocation information for each frame is calculated in the encoder apparatus based only upon the relative magnitudes of the data samples to be encoded, as indicated by respective scale factors. Since the bit allocation information for each frame is not transmitted in the encoded data stream, it is again calculated in the decoding apparatus, in the same way as in the encoding apparatus. This is made possible by the fact that only the scale factors are used in deriving the bit allocation data, with the present invention.

As a result, a substantially increased number of bits become available in each frame for encoding the audio data, thereby enabling the frame length to be shortened and the encoding/decoding delay time to be accordingly shortened without increasing the bit rate of the encoded data, and without deterioration of audio reproduction quality, in spite of the fact that such a reduction of the frame length signifies that an increased proportion of the total number of bits constituting each frame must be allocated to data other than the encoded audio data.

The present invention is preferably applied to an encoding and decoding system whereby an encoder apparatus executes a mapping operation on each of successive sets of samples of a digital audio signal encoder, to obtain respective sets of sub-band samples corresponding to a fixed plurality of sub-bands which cover the audio frequency range, with respective scale factors being calculated for these sets of sub-band samples, with bit allocation information being calculated based upon the scale factors, and with each of the sets of sub-band samples which are of sufficient magnitude to be encoded then being normalized and quantized in accordance with the bit allocation information. Each of these sets of quantized sub-band samples, and the entire set of scale factors (corresponding to all of the sub-bands), are then encoded and transmitted within one frame of an encoded data stream. The decoding apparatus of such a system extracts and decodes the quantized sub-band samples and scale factors from each of these frames, operates on the scale factora to derive the same bit allocation information as that which was calculated in the encoder apparatus, and utilizes that bit allocation information to dequantize the quantized sub-band samples. The dequantized sub-band samples are then subjected to a mapping operation which is the inverse of the mapping operation executed by the decoder apparatus, to thereby recover the originally encoded set of samples of the digital audio signal.

According to another aspect of the invention, rather than encoding within each frame the entire set of scale factors, corresponding to all of the sub-bands, only those scale factors which are different from the scale factor of the corresponding sub-band within the preceding frame are encoded and transmitted. In that way, since the number of frame bits which must be allocated to the scale factors can be reduced, the number of bits which can be allocated to encoding the audio data can be further increased, thereby enabling the audio reproduction quality to be enhanced.

More specifically, the invention provides a method of encoding a digital audio signal to generate each of successive frames constituting an encoded bitstream by applying a mapping operation to a set of successive data samples of the digital audio signal to obtain a plurality of sets of sub-band samples which correspond to respective ones of a fixed plurality of sub-bands, calculating respective scale factors corresponding to each of the sets of sub-band samples, using the scale factors to calculate bit allocation information, quantizing the sub-band samples in accordance with the bit allocation information and the scale factors, encoding the scale factors and quantized sub-band samples, and assembling a frame as a formatted bit sequence which includes respective sets of bits constituting the encoded scale factors and the encoded quantized sub-band samples, while excluding the bit allocation information.

The invention further provides a method of decoding such an encoded bitstream, comprising separating the scale factors and the quantized sub-band samples from the frame, utilizing the scale factors to calculate the bit allocation information, utilizing the bit allocation information and the scale factors to dequantize the sub-band samples, and applying inverse transform processing to the dequantized sub-band samples to recover a corresponding set of successive samples of the digital audio signal.

The invention also provides a method of encoding a digital audio signal to generate each of successive frames constituting an encoded bitstream by applying a mapping operation to a set of successive data samples of the digital audio signal to obtain a plurality of sets of sub-band samples which corresponding to respective ones of a fixed plurality of sub-bands, calculating respective scale factors corresponding to each of the sets of sub-band samples, comparing each scale factor with the corresponding scale factor of the preceding frame and in the event that coincidence is detected, setting a corresponding scale factor flag to a first condition, while when non-coincidence is detected setting the corresponding scale factor flag to a second condition, using the scale factors to calculate bit allocation information, quantizing each of the sets of sub-band samples in accordance with the bit allocation information and the scale factors, and selecting each of the scale factors for which coincidence was detected, encoding the selected scale factors and the quantized sub-band samples, and assembling the frame as a formatted bit sequence which includes respective sets of bits constituting the scale factor flags, the encoded scale factors, and the encoded quantized sub-band samples, while excluding the bit allocation information.

The invention further provides a method of decoding each frame of such an encoded bitstream comprising separating the scale factor flags, the selected scale factors and the quantized sub-band samples from the frame, successively judging each of the scale factor flags, and when the scale factor flag is found to be in the aforementioned first condition, specifying that a corresponding scale factor of the preceding frame is to be utilized while, when the scale factor flag is found to be in the aforementioned second condition, specifying a corresponding scale factor which is conveyed by the currently received frame, to be utilized, then using the specified scale factors to calculate the bit allocation information for the currently received frame, utilizing the bit allocation information and the specified scale factors to dequantize the sub-band samples, and applying an inverse mapping operation to the dequantized sub-band samples, to recover a corresponding set of successive samples of the digital audio signal.

The invention further provides an encoding apparatus and a corresponding decoding apparatus for an encoding and decoding system to transmit a digital audio signal as an encoded bitstream formatted as a sequence of frames. The encoding apparatus of such a system comprises mapping means for operating on a set of samples of the digital audio signal, i.e., a set of samples whose data are to be conveyed by one frame, to obtain a plurality of sets of sub-band samples, with these sets respectively corresponding to a fixed plurality of sub-bands, scale factor calculation means for calculating respective scale factors for these sets of sub-band samples, bit allocation information calculation means for operating on the scale factors to calculate bit allocation information for the frame, quantization means for quantizing the sub-band samples based on the bit allocation information and the scale factors, and frame packing means for encoding the scale factors and quantized sub-band samples and assembling the frame as a formatted bit sequence which includes respective sets of bits constituting the encoded scale factors and the encoded quantized sub-band samples, while excluding the bit allocation information.

The corresponding decoding apparatus of such a system comprises frame unpacking means for operating on each of the frames to separate the scale factors and the quantized sub-band samples, bit allocation information calculation means for operating on the scale factors to calculate the bit allocation information for the frame, data reconstruction means for operating on the bit allocation information and the scale factors to recover a set of dequantized sub-band samples, and inverse mapping means for operating on the dequantized sub-band samples to recover a set of successive samples of the digital audio signal.

The invention further provides an encoding apparatus and a corresponding decoding apparatus for an encoding and decoding system to transmit a digital audio signal as an encoded bitstream formatted as a sequence of frames, whereby the number of frame bits which must be allocated to the scale factors of the encoded audio data can be minimized. The encoding apparatus of such a system comprises:

mapping means for operating on a set of samples of the digital audio signal, i.e., a set of samples whose data are to be conveyed by one frame, to obtain a plurality of sets of sub-band samples, with these sets respectively corresponding to a fixed plurality of sub-bands, scale factor calculation means for calculating respective scale factors for these sets of sub-band samples, scale factor judgement means including memory means, for comparing each of the scale factors of a frame with a corresponding scale factor which is stored in the memory means and is of a preceding one of the frames, for setting a scale factor flag which is predetermined as corresponding to the scale factor to a first condition when coincidence is detected as a result of the comparison, and for setting the scale factor flag to a second condition and selecting the corresponding scale factor to be encoded, when non-coincidence is detected as a result of the comparison, bit allocation information calculation means for operating on the scale factors to calculate bit allocation information for the frame, quantization means for quantizing the sub-band samples based on the bit allocation information and the scale factors, and frame packing means for encoding the selected scale factors and quantized sub-band samples and assembling the frame as a formatted bit sequence which includes respective sets of bits constituting the scale factor flags, the encoded selected scale factors and the encoded quantized sub-band samples, while excluding the bit allocation information.

The decoding apparatus of such a system comprises:

frame unpacking means for operating on each of the frames to separate the scale factor flags, the selected scale factors and the quantized sub-band samples, scale factor restoration means including memory means, for judging the condition of each of the scale factor flags and when a scale factor flag is judged to be in the first condition, reading out a scale factor from a memory location corresponding to the sub-band of the scale factor flag, and outputting the scale factor, while when the scale factor flag is judged to be in the second condition, outputting the corresponding one of the selected scale factors conveyed by the frame, and writing that scale factor into the memory means, bit allocation information calculation means for operating on the scale factors produced by the scale factor restoration means, to calculate the bit allocation information for the frame, data reconstruction means for operating on the bit allocation information and the scale factors to recover a set of dequantized sub-band samples, and inverse mapping means for operating on the dequantized sub-band samples of the frame, to recover a set of samples of the digital audio signal.

DESCRIPTION OF PREFERRED EMBODIMENTS

Figure 1:
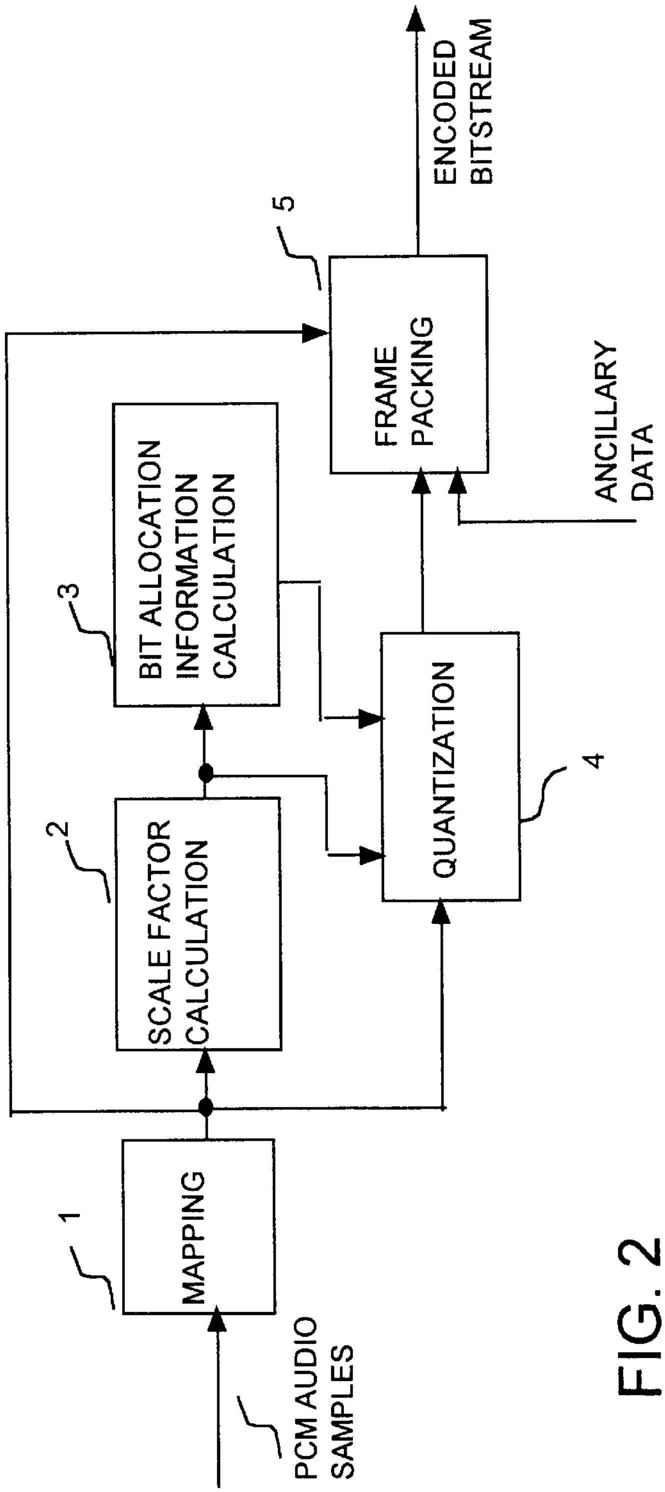
FIG. 1 illustrates an algorithm of a first embodiment of an audio signal encoding method according to the present invention.
Figure 2:
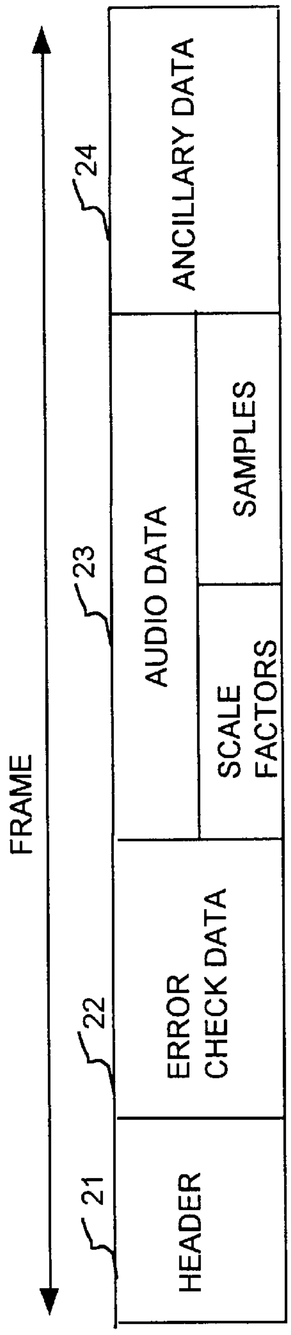
FIG. 2 is a diagram showing the configuration of each frame of an encoded bitstream which is produced by the first audio signal encoding method embodiment.

A first embodiment of an audio signal encoding method according to the present invention will be described, referring to FIGS. 1 and 2. FIG. 1 illustrates the various processing stages of this audio signal encoding method embodiment, while FIG. 2 shows the frame format of the encoded bitstream which is produced. In FIG. 1, numeral 1 designates a mapping stage, whereby PCM digital audio signal samples are decomposed to obtain sub-band samples. Numeral 2 designates a scale factor calculation stage, numeral 3 denotes a bit allocation information calculation stage, numeral 4 denotes a quantization stage, and numeral 5 denotes a frame packing stage. As shown in FIG. 2, each frame of the encoded data bitstream is made up of a header 21, an error check portion 22, an audio data portion 23 formed of a set of encoded scale factors and a set of encoded quantized sub-band samples. In addition, an ancillary data portion 24 may also be included.

The operation of this embodiment is as follows. In the mapping stage 1, successive sets of PCM audio data samples are subjected to transform processing to derive a corresponding set of mapped samples, with the number of usable samples within that mapped set being fewer than the corresponding set of input PCM samples, i.e. some thinning-out of samples occurs. It will be assumed that the mapping operation consists of applying-sub-band filtering to each of successive sets of PCM audio data samples, to derive corresponding sets of sub-band samples, i.e., with each of successive sets of 32 input PCM audio data samples being mapped onto a corresponding set of 32 sub-band samples, and with the contents of 3 of such sets of 32 PCM audio data samples (96 samples) being conveyed in encoded form by one frame.

In the scale factor calculation stage 2 each time that a complete set of three sub-band samples of one of the sub-bands have been obtained from the mapping stage 1, for insertion in a frame, a scale factor is calculated for that set of samples. That is to say, respective scale factors are calculated for each of the sub-bands, for one frame. When all of the samples that are to be inserted into a frame have been produced, the 32 scale factors which have been calculated for the respective sub-bands are used in the bit allocation information allocation stage 3, to derive the bit allocation information. The bit allocation information specifies, for each of the sub-bands, the number of quantization levels, and hence the number of quantization bits, which are to be used in quantizing each of the sub-band samples of that sub-band.

The operation of the bit allocation information allocation stage 3 can be similar to that of the iterative bit allocation method that is described in Annex C of ISO/IEC 11172-3, but applied to signal-tonoise ratio values for each sub-band, as opposed to the respective mask-to-noise ratios of the sub-bands. Such a method will allocate a relatively large number of quantization bits for quantizing the sub-band samples of each sub-band having a small value of scale factor, and a smaller number of bits to each sub-band which has a large scale factor, i.e., will allocate the total number of bits that are available for quantizing the sub-band samples of a frame such as to substantially balance the respective signal-to-noise ratios of the quantized samples.

In the quantization stage 4, the sub-band samples derived for a frame are quantized in accordance with the bit allocation information which has been calculated for that frame. Specifically, for each of the sub-bands, the corresponding set of sub-band samples are first normalized by using the scale factor that has been calculated for that sub-band in the bit allocation information allocation stage 2, then each of these normalized samples is quantized, using the number of quantization bits that is specified for that sub-band by the bit allocation information.

If it is judged in the bit allocation information allocation stage 3 that the magnitude of the scale factor calculated for a sub-band is insufficient, indicating that it would not be practicable to quantize the samples derived for that sub-band, then a scale factor of zero is allocated to that sub-band, signifying that the samples derived for that sub-band are not to be quantized and inserted into the current frame. However the scale factor calculated for such a sub-band is inserted into the frame.

In the frame packing stage 5, the header and error check data are generated, and these together with the sets of quantized sub-band samples corresponding to each of the sub-bands for which a non-zero number of quantization bits has been allocated, the scale factors derived for all of the sub-bands and the ancillary data are encoded, and the resultant sets of bits are then arranged in the frame format shown in FIG. 2. It can be understood that the audio data 23 conveyed by each frame corresponds to a fixed number of the original input audio data sample (e.g., 96 samples).

Figure 15:
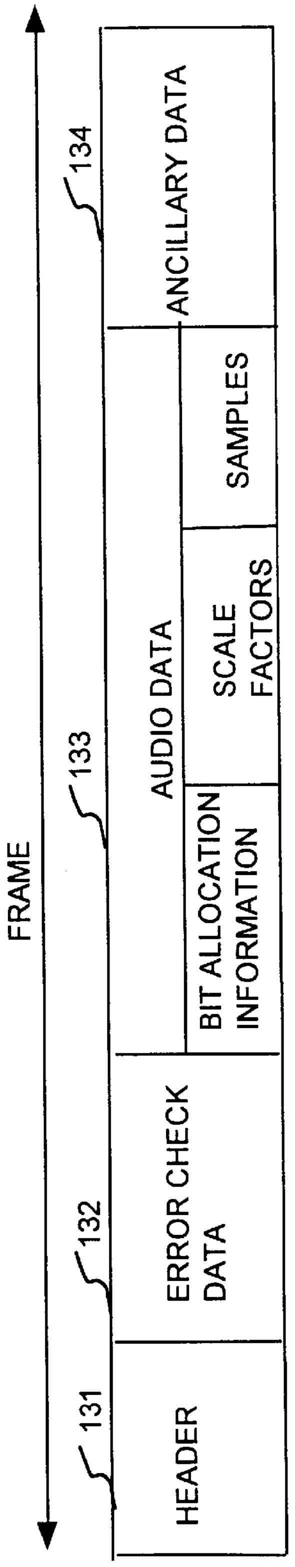
FIG. 15 PRIOR ART
FIGS. 15, 16 and 17 illustrate the frame configuration of the encoded data stream generated by MPEG-1 audio Layer 1, Layer 2, and Layer 3 encoding, respectively.
Figure 16:
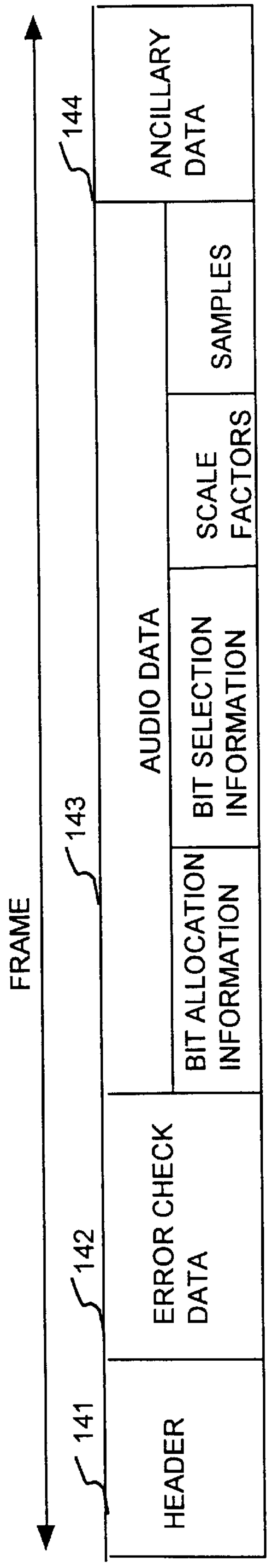
FIG. 16 PRIOR ART
Figure 17:
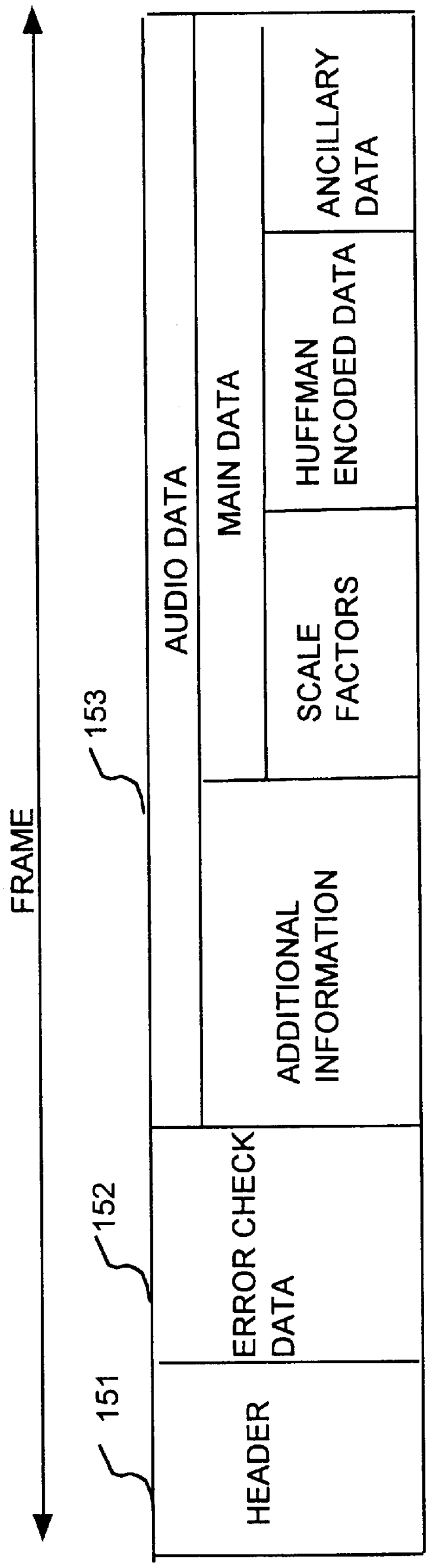
FIG. 17 PRIOR ART

FIG. 2 shows the bitstream format of the encoded bitstream generated by this embodiment. As shown, the bit allocation information which is inserted in each frame of the prior art MPEG-1 Layer 1 frame format shown in FIG. 15 is omitted from the frame format of FIG. 2.

Since it is not necessary to allocate bits for conveying bit allocation information within each frame, with this embodiment, greater encoding efficiency can be achieved. That is to say, a greater number of bits can be assigned to quantize the sub-band samples of a frame than is possible with the prior art encoding methods described hereinabove. This enables the frame length to be made shorter than with the prior art methods, without deterioration of the reproduction quality of the final audio signal. If for example the frame length is reduced from the 384 digital audio signal samples of MPEG-1 Layer 1, to 96 samples then assuming as described hereinabove that the total number of bits constituting one frame becomes 256, with 32 of these bits being assigned to the header, then since the 128 bits required for the bit allocation information become available, a total of 224 bits can now be allocated to the encoded scale factors and audio samples in each frame. That is, whereas with the original frame length of MPEG-1 Layer 1 encoding an average of 2.25 bits are available for each of the digital audio signal samples in the case of the example described hereinabove using a bit rate of 128 kbit/s and 1024 bits/frame, with the first embodiment of the present invention, if the frame length is reduced to ¼ of its original value so that the scale factors and sub-band samples in one frame express 96 samples of the original audio signal, then an average of 224/96, i.e., approximately 2.33 bits becomes available for each of the digital audio signal samples. Hence, it becomes possible to reduce the frame length and thereby reduce the encoding delay time, without a lowering of audio reproduction quality.

Figure 3:
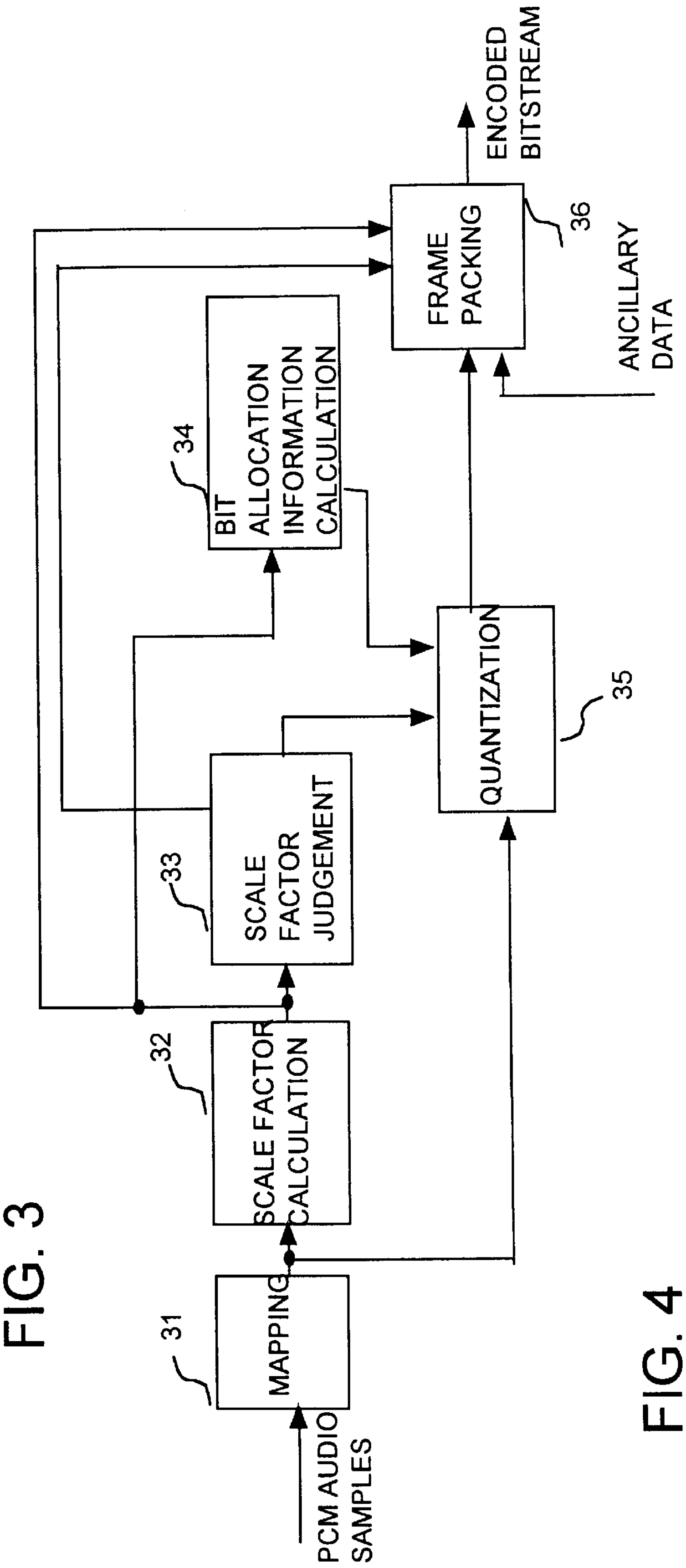
FIG. 3 illustrates an algorithm of a second embodiment of an audio signal encoding method according to the present invention.
Figure 4:
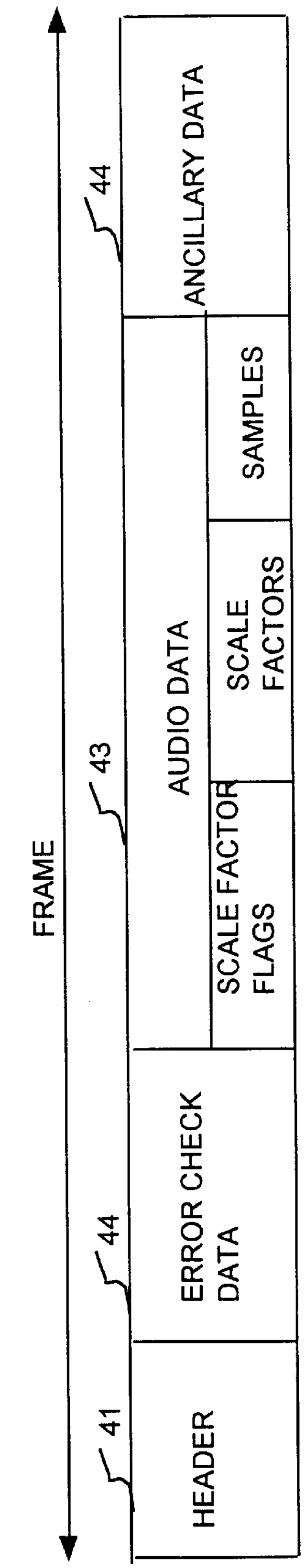
FIG. 4 is a diagram showing the configuration of each frame of an encoded bitstream which is produced by the second audio signal encoding method embodiment.

A second embodiment of an audio signal encoding method according to the present invention will be described, referring to FIGS. 3 and 4. FIG. 3 illustrates the various processing stages of this audio signal encoding method embodiment, while FIG. 4 illustrates the frame format of the encoded bitstream which is produced. In FIG. 3, numeral 31 designates a mapping stage, functioning as described hereinabove for the mapping stage 1 of the first embodiment, numeral 32 designates a scale factor calculation stage, numeral 33 denotes a scale factor determining stage, 34 denotes a bit allocation information calculation stage, numeral 35 denotes a quantization stage, and numeral 36 denotes a frame packing stage of the method. As shown in FIG. 4, each frame of the encoded data bitstream is made up of a header 41, an error check portion 42, an audio data portion 43 which is formed of a set of scale factor flags each relating to a specific one of the sub-bands, a set of encoded scale factors and a set of encoded quantized sub-band samples, and an ancillary data portion 44.

As described hereinabove, each time a set of input PCM audio data sample is processed in the mapping stage 31, to derive a set of sub-band samples which respectively correspond to the various sub-bands, usable sub-band samples will in general be derived only for a part of the entire set of sub-bands. With the prior art MPEG-1 audio encoding methods, scale factors are encoded and inserted into a frame only for each sub-band for which a set of valid sub-band samples have been derived and so for which allocation of bits is specified in the bit allocation information (the remaining sub-bands being referred to in ISO/IEC 1172-3 as "non-transmitted sub-bands", with respect to that frame). This omission of scale factors from the transmitted frames is possible since the bit allocation information can be used by a decoder apparatus to ascertain the relationship between scale factors contained in a transmitted frame and the corresponding sub-bands, i.e., it is known that if zero quantization bits are assigned to a sub-band, then the scale factor corresponding to that sub-band is not transmitted.

However with the present invention, since no bit allocation information is transmitted, it is necessary that the scale factors for all of the sub-bands, for each frame, be available for use in decoding process, as described hereinafter.

For that reason, the second embodiment of an audio signal encoding method according to the present invention is designed to provide an improvement over the first embodiment described above, by achieving greater efficiency of encoding the complete set of scale factors which must be conveyed in each frame, as described in the following.

Referring to FIG. 3, successive sets of sub-band samples corresponding to respective ones of the sub-bands are derived in the mapping stage 31 by sub-band filter processing as described for the first embodiment, with a scale factor being calculated for each set of successive sub-band samples (e.g., 3 sub-band samples, assuming a total of 32 sub-bands and that each frame conveys the contents of 96 audio data sample) corresponding to a sub-band, in the scale factor calculation stage 32, as described for bit allocation information allocation stage 2 of the preceding method embodiment. However with this embodiment, when an initial frame is encoded, the scale factors which are derived corresponding to the sub-bands are written into respectively predetermined memory locations, in the scale factor judgement stage 33. Thereafter, each time that a new frame is encoded, when a scale factor is calculated for a sub-band, the immediately preceding scale factor calculated for that sub-band is read out from memory and compared with the new scale factor. If these scale factors are not identical, then the new scale factor is written into memory as an updated scale factor for that sub-band and is selected to be inserted within the current frame, in the frame packing stage 36. A scale factor flag which has been predetermined as corresponding to that sub-band is then set to a predetermined state, e.g. is set to 1. However if the newly calculated scale factor and the scale factor that is read out of memory are found to be identical, then the scale factor flag for that sub-band is set to the other state, e.g. is set to 0, and the scale factor for that sub-band is not transmitted within the current frame. The resultant scale factor flags for all of the sub-bands are inserted into the encoded bitstream in the frame packing stage 36.

In the bit allocation information calculation stage 34, bit allocation information is calculated from the scale factors derived for the respective sub-bands, in the same way as for the bit allocation information allocation stage 3 of the preceding embodiment.

In the frame packing stage 36, the aforementioned selected scale factors, for one frame, are encoded as respective fixed-size sets of bits, and are combined with the respective scale factor flags for each of the sub-bands and the quantized encoded samples as a sequence of bits constituting the audio data portion 43 of the frame format shown in FIG. 4. That is combined with the bits expressing the header 41, error check data 42 and ancillary data 44, to constitute the entire frame.

It can thus be understood that this embodiment provides the advantages of the preceding embodiment described above, i.e. the elimination of bit allocation information from each transmitted frame, and also provides the advantage of improved encoding efficiency, since each scale factor is inserted into a frame only if it is different from the scale factor of the corresponding sub-band in the preceding frame. Thus, by comparison with the first embodiment described above, the second embodiment of an audio signal encoding method enables a reduction of the number of bits which must be assigned to the scale factors, in each frame, and thereby enables a greater number of bits to be assigned to the sub-band samples. Hence, if the frame length is shortened by comparison with the prior art in order to achieve a reduction of the encoding delay time as described hereinabove, with the bit rate of the encoded data stream left unchanged, a further improvement in reproduced sound quality can be achieved by utilizing the method of the second embodiment.

Figure 5:
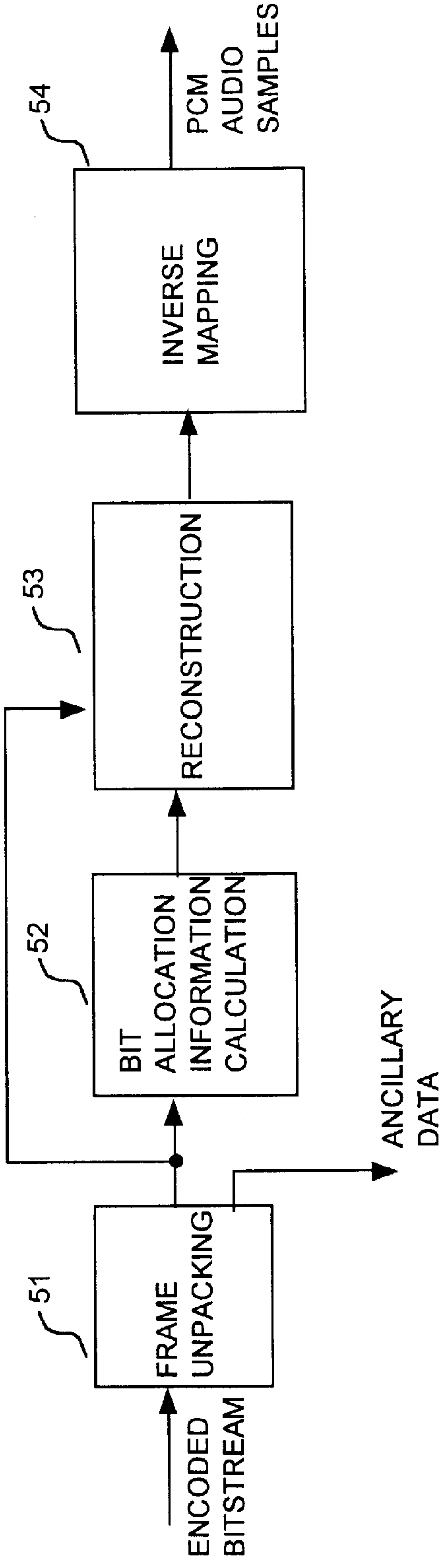
FIG. 5 illustrates an algorithm of a first embodiment of an audio signal decoding method according to the present invention.

FIG. 5 illustrates an embodiment of an audio signal decoding method corresponding to the audio signal encoding method of FIG. 1. This consists of a frame unpacking stage 51, a bit allocation information calculation stage 52, a reconstruction stage 53 and an inverse mapping stage 54. Before describing the operation of this embodiment, the basic information that is necessary for decoding the encoded audio data sample will be discussed. With the MPEG-1 audio Layer 1 frame format shown in FIG. 15, the length of the scale factor portion of the audio data portion 133 is variable, since a scale factor is only transmitted for a sub-band if a non-zero number of bits is assigned to the samples of that sub-band by the bit allocation information. However since the bit allocation information is transmitted to the decoder within each frame, the decoding can readily determine the correspondence between the received scale factors and the respective sub-bands, and also the correspondence between the sets of bits which express respective encoded audio samples and the respective sub-bands. With the method of the present invention, since the bit allocation information is not transmitted in the encoded bitstream, the decoder must use the scale factors conveyed in the scale factor portion of the audio data portion of each frame, to calculate the bit allocation information. The bit allocation information can then be used to extract the sets of bits which express respective encoded audio samples (i.e., sub-band samples), and to correctly relate these to their corresponding sub-bands. Referring for example to the frame format of FIG. 2, since all of the scale factors for the 32 sub-bands are transmitted in each frame, with each scale factor being encoded for example as 6 bits, the length of the scale factor portion of the audio data portion 23 will be fixed as 192 bits, so that the position of the start of the encoded samples portion of the audio data portion 23 is fixed. By generating the bit allocation information for a frame, the decoder apparatus can determine those sub-bands for which zero bits have been assigned, and the respective numbers of bits which have been assigned to each of the quantized samples of each of the other sub-bands. These sub-band samples can thereby be extracted from the audio samples portion of the audio data portion 23 of the frame, correctly related to their corresponding sub-bands.

Referring now to FIG. 5, in the frame unpacking stage 51, each frame is analyzed to separate it into its various component portions shown in FIG. 2, i.e. the header, the error check data, the scale factors, etc., and to decode and output these. In the bit allocation information calculation stage 52, the scale factors extracted from the frame are used to calculate the bit allocation information for that frame. In the reconstruction stage 53, the bit allocation information is used in conjunction with the scale factors for the frame as described hereinabove to dequantize the sub-band samples from the audio data portion 23 of the frame. In the inverse mapping stage 54, inverse mapping processing is applied to the sub-band samples, that is to say, a transform from the frequency domain back to the time domain, to recover an original set of digital audio signal samples (e.g., 96 digital audio signal samples) from the sub-band samples conveyed by that frame.

It can thus be understood that the encoder embodiment of FIG. 1 in combination with the decoder embodiment of FIG. 5 enables encoded audio data to be transmitted as a sequence of frames without the need to insert bit allocation information into each frame, as has been necessary in the prior art. As a result, a greater number of bits is made available within each frame for allocation to the encoded audio data sample. Hence, a shorter frame length can be utilized, resulting in a correspondingly shorter value of encoding delay as described hereinabove, without altering the bit rate of the encoded data stream and without lowering the quality of audio reproduction.

Figure 6:
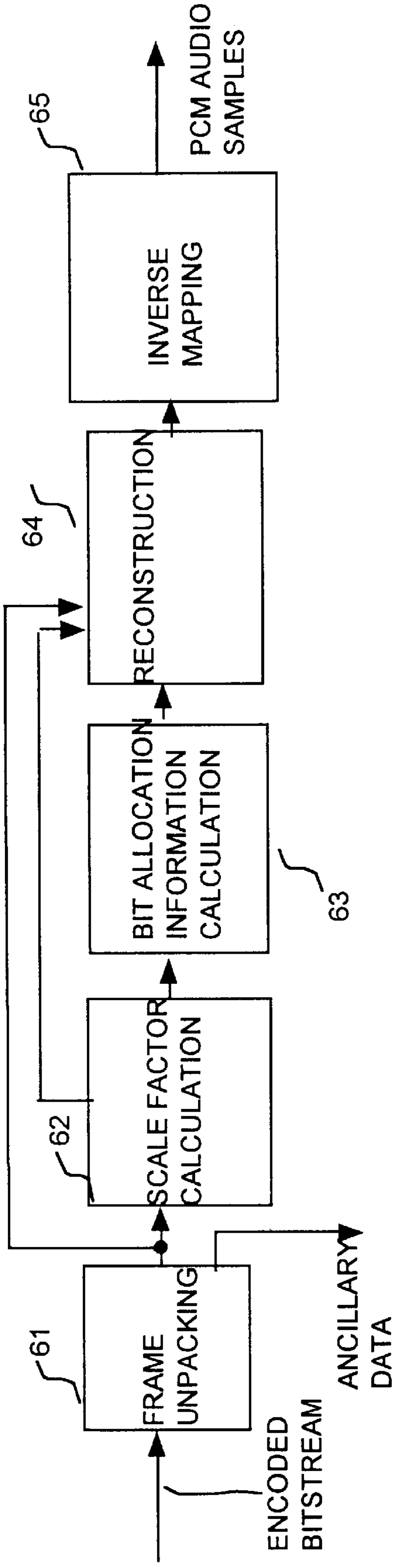
FIG. 6 illustrates an algorithm of a second embodiment of an audio signal decoding method according to the present invention.

FIG. 6 illustrates an embodiment of an audio signal decoding method corresponding to the audio signal encoding method of FIG. 3. This consists of a frame unpacking stage 61, a bit allocation information calculation stage 63, a reconstruction stage 64 and an inverse mapping stage 65, whose functions correspond to those of the frame unpacking stage 51, bit allocation information calculation stage 52, reconstruction stage 53 and inverse mapping stage 54 of the embodiment of FIG. 5 described above. However since the audio signal encoding method of FIG. 3 results in the encoded bitstream being transmitted as frames containing scale factor flags as described hereinabove referring to FIG. 4, the audio signal decoding method embodiment of FIG. 6 includes a scale factor restoration stage 62, whose function is to utilize the information conveyed by the scale factor flags to generate a complete set of scale factors for each received frame, i.e. scale factors respectively corresponding to each of the sub-bands.

With the embodiment of FIG. 6, when a frame of the encoded bitstream is received, then in the frame unpacking stage 61, the sets of bits which express the quantized sub-band samples are extracted, as are also the scale factors for all of the sub-bands, and those scale factors which have been selected to be transmitted in that frame as described hereinabove referring to FIGS. 3 and 4. The processing executed in the scale factor restoration stage 62, for each received frame, is as follows. The scale factor flags of the received frame are successively examined. If the state of the first scale factor flag indicates that the corresponding scale factor has been selected to be transmitted in that frame, then the first of the received scale factors of that frame is set into a memory (i.e., in a memory location which has been predetermined for use by the sub-band corresponding to that scale factor), as an updated stored scale factor for the corresponding sub-band. If the state of the first scale factor flag indicates that the corresponding scale factor has not been transmitted in that frame, then the scale factor which is held in a memory location predetermined for use by the sub-band corresponding to that scale factor flag is read out from the memory. That process is successively repeated for each of the received scale factor flags, to thereby obtain a complete set of scale factors for the received frame, with each scale factor being either obtained from the received frame or read out from memory.

The scale factors which are thereby obtained in the scale factor restoration stage 62 are utilized in the bit allocation information calculation stage 63 to generate the bit allocation information for the received frame, in the same manner as for the embodiment of FIG. 5. The bit allocation information, in conjunction with the scale factors extracted from the frame, are used in the reconstruction stage 64 to dequantize the quantized sub-band samples which are extracted from the received frame, so that respective sets of sub-band samples corresponding to each of the sub-bands are recovered. In the inverse mapping stage 65, inverse mapping of these sub-band samples is executed, to recover the complete set of time-domain PCM digital audio signal samples (e.g., 96 samples) whose contents are conveyed by the received frame.

It can thus be understood that the encoding method embodiment of FIG. 3 in combination with the decoding method embodiment of FIG. 6 enables more efficient encoding of audio data to be achieved than is possible with the combination of the encoding method embodiment of FIG. 1 and the decoding method embodiment of FIG. 5, since a scale factor is encoded and inserted into a frame only if that scale factor is different from the scale factor of the corresponding sub-band in the immediately preceding frame. Hence, a greater number of bits become available for assignment to encoding the sub-band samples, so that a further improvement in quality of audio reproduction can be achieved.

Figure 7:
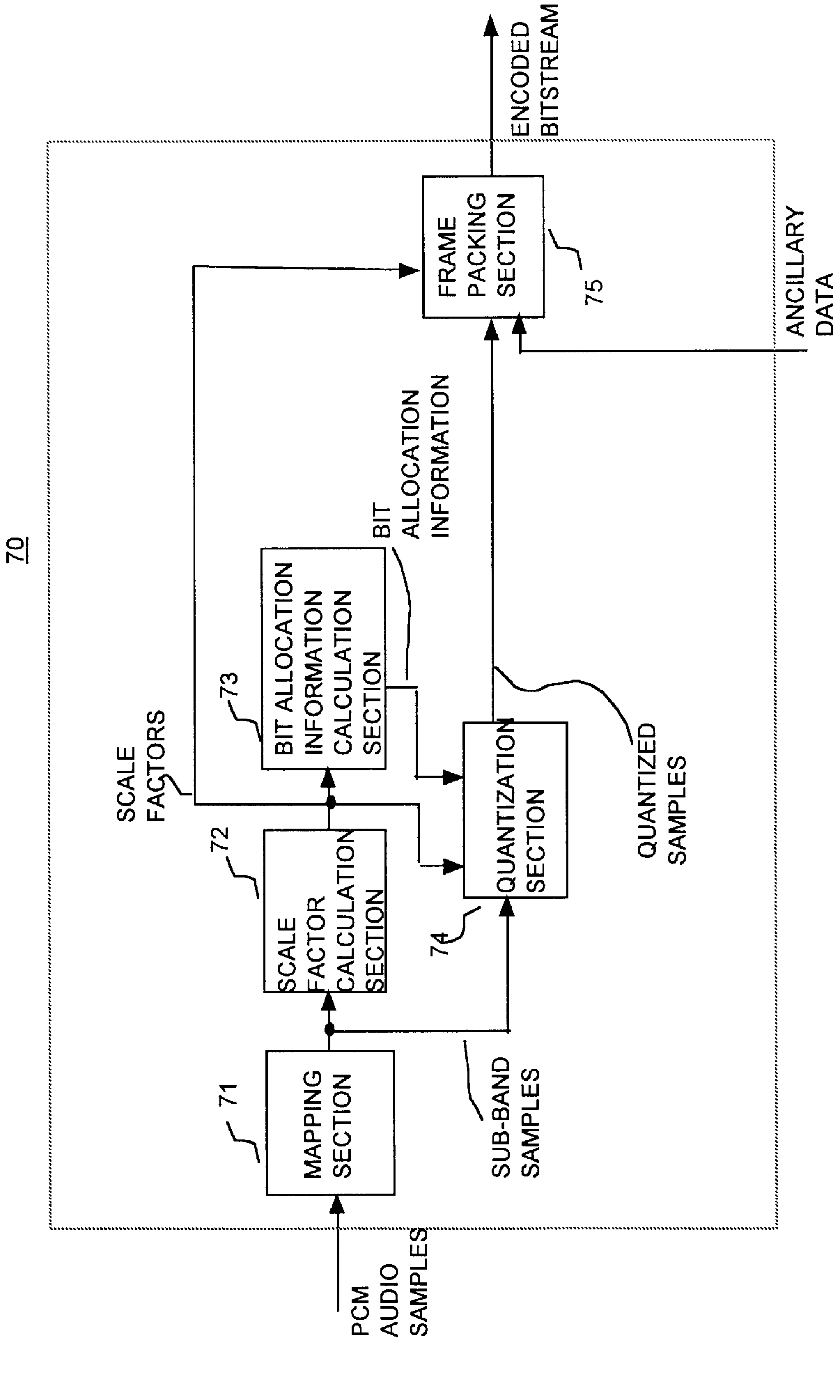
FIG. 7 is a general system block diagram of a first embodiment of an audio signal encoding apparatus according to the present invention.

A first embodiment of an audio signal encoding apparatus according to the present invention will be described referring to the general system block diagram of FIG. 7, which implements the first audio signal encoding method of FIG. 1 described hereinabove. The audio signal encoding apparatus of FIG. 7 is formed of a mapping section 71 which contains a bank of sub-band filters for decomposing each of successive sets of input PCM digital audio signal samples to sub-band samples of respective ones of a plurality of sub-bands. For the purpose of description, it will be again assumed that 32 sub-bands are utilized, with 32 sub-band samples (i.e., one sample for each sub-band) being produced by the mapping section 71 in response to each set of 32 input audio data samples. The scale factor calculation section 72 receives the sub-band samples to be inserted in each frame from the mapping section 71, and calculates respective scale factors for each of the sub-bands. The scale factors are supplied to the bit allocation information calculation section 73, which generates bit allocation information specifying the respective numbers of bits which are to be allocated to each of the sub-bands, for quantizing each of the sub-band samples of that sub-band for one frame. The sub-band samples, scale factors, and bit allocation information for one frame are supplied to the quantization section 74, which quantizes the sub-band samples of each sub-band in accordance with the number of quantization bits that is specified for that sub-band by the bit allocation information (i.e., each sub-band for which a non-zero number of quantization bits is specified by the bit allocation information).

The quantized sub-band samples, the scale factors, and ancillary data for one frame are supplied to the frame packing section 75, which generates the header and error check data for that frame, and encodes the header, error check data, quantized sub-band samples, scale factors, and the ancillary data for that frame into a stream of bits having the format shown in FIG. 2 and described hereinabove. Assuming that three successive sets of 32 digital audio samples are processed by the mapping section 71 to derive sub-band samples for each frame, i.e., if 96 input PCM digital audio signal samples are conveyed in encoded form by each frame, the audio data portion of each frame contains all of the 32 scale factors derived for the sub-bands, and the respective sets of three sub-band samples corresponding to each of the sub-bands for which a non-zero number of quantization bits has been allocated by the bit allocation information of that frame. However the bit allocation information itself is not contained in the frame, so that the advantages of an increased number of bits being available for encoding the audio data are obtained, as described hereinabove for the first audio signal encoding method.

Figure 11:
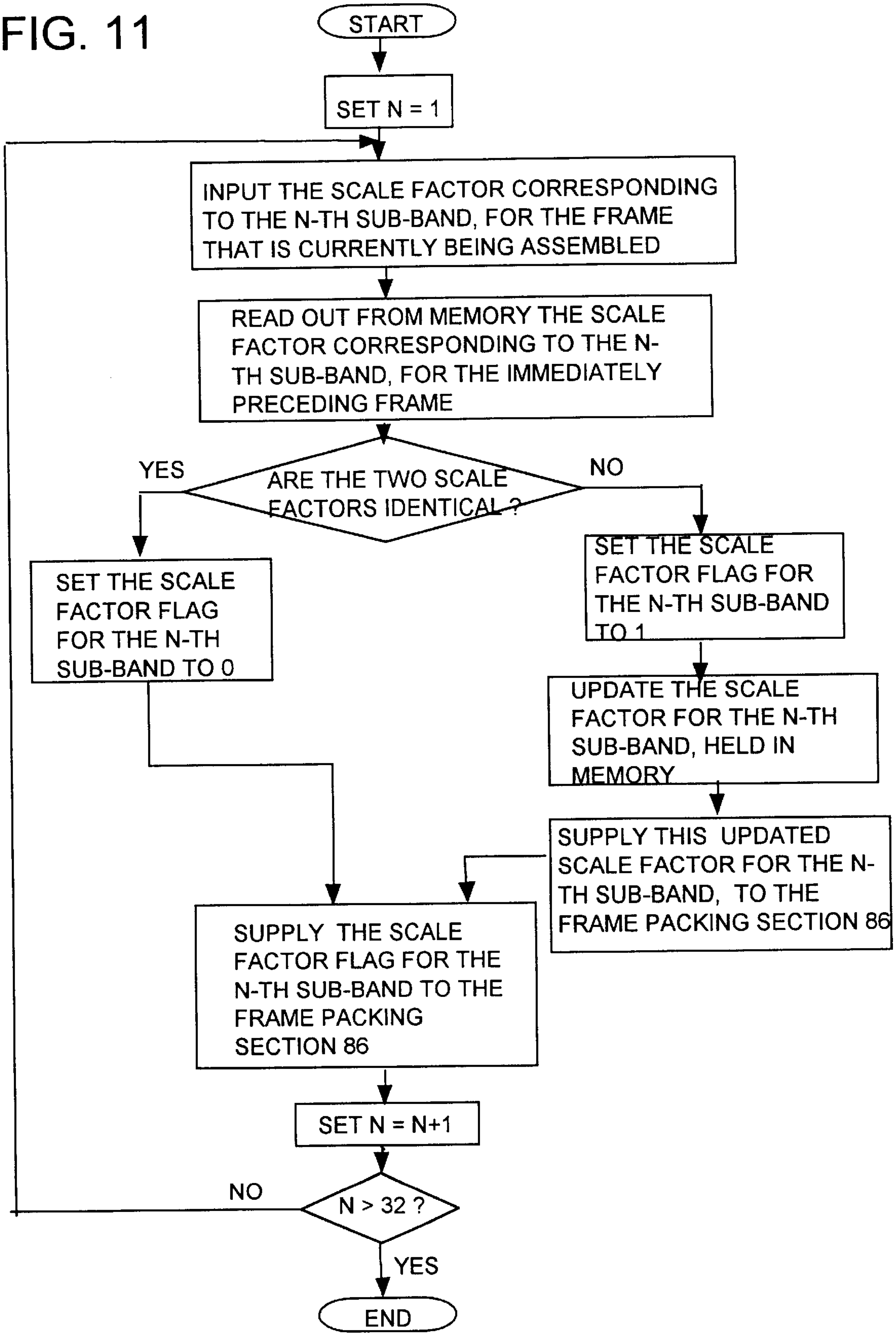
FIG. 11 is a flow diagram for illustrating processing which is executed by a scale factor judgement section in the audio signal encoding apparatus embodiment of FIG. 8.

A second embodiment of an audio signal encoding apparatus according to the present invention will be described referring to the general system block diagram of FIG. 8, which implements the second audio signal encoding method embodiment of FIG. 3 described hereinabove. The audio signal encoding apparatus is formed of a mapping section 81, a bit allocation information calculation section 84, a scale factor judgement section 83, a quantization section 85, a frame packing section 86 and a frame packing section 86. The mapping section 81 can be configured as for the mapping section 71 of FIG. 7 described above, with the respective sets of sub-band samples of the sub-bands, for one frame, being supplied from the mapping section 81 to the bit allocation information calculation section 84 for calculation of the respective scale factors for each of the sub-bands. The calculated scale factors are supplied to the scale factor judgement section 83 and to the quantization section 85. The scale factor judgement section 83 contains a memory (not shown in the drawing) having respective memory locations predetermined as corresponding to each of the sub-bands, and executes an algorithm of the form shown in the flow diagram of FIG. 11 (in which it is again assumed that the number of sub-bands is 32). As shown, each of the scale factors for one frame is successively examined by the scale factor judgement section 83, to judge whether the scale factor is identical to the scale factor of the corresponding sub-band of the immediately preceding frame, with the latter scale factor being read out from memory. If they are not identical, then the new scale factor is written into the memory location for that sub-band, and that scale factor is selected to be conveyed by the current frame, while the corresponding scale factor flag is set to a predetermined corresponding condition, e.g., 1. Otherwise, the corresponding scale factor flag is set to the other condition, e.g. 0.

The scale factor flags are supplied to the frame packing section 86, and the selected scale factors are supplied from the scale factor judgement section 83 to the quantization section 85 and to the frame packing section 86.

The quantization section 85 operates on the scale factors for one frame to derive bit allocation information for that frame, as described for the preceding embodiment, and the bit allocation information is supplied to the frame packing section 86, to be used in quantizing the sub-band samples of each of the sub-bands for which a non-zero number of quantization bits has been allocated.

The quantized sub-band samples, the scale factors, the scale factor flags, and ancillary data for one frame are supplied to the frame packing section 86, which generates the header and error check data for that frame, and encodes the header, error check data, quantized sub-band samples, and the ancillary data for that frame into respective bit sequences, which are combined with the scale factor flags derived for that frame in the frame format shown in FIG. 4, described hereinabove.

Figure 8:
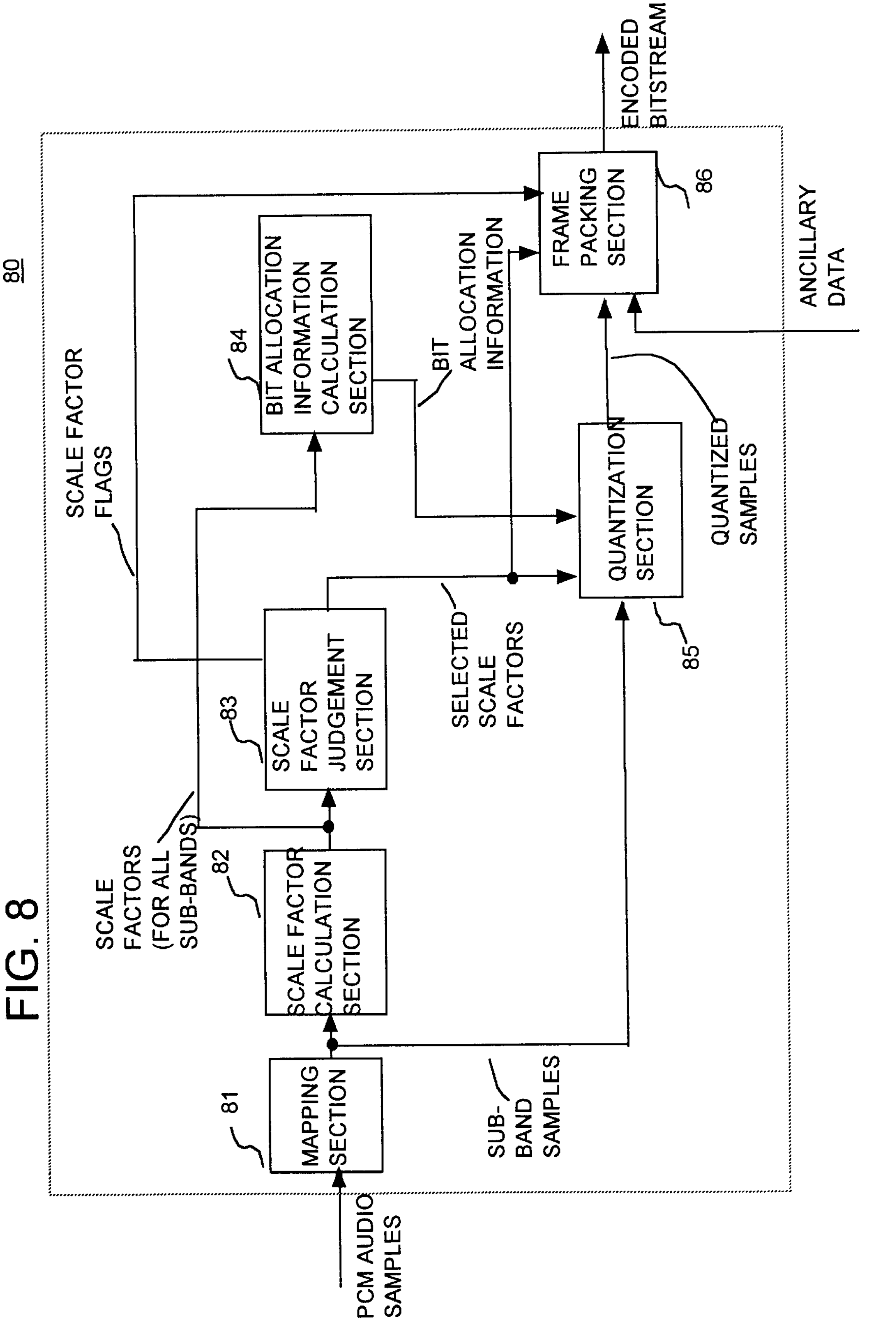
FIG. 8 is a general system block diagram of a second embodiment of an audio signal encoding apparatus according to the present invention.

Thus, since only each scale factor which is different from the scale factor of the corresponding sub-band in the preceding frame is inserted into the current frame, with this encoding embodiment, the number of frame bits which become available for quantizing the sub-band samples that express the audio data conveyed by a frame is further increased, by comparison with the first audio signal encoding method embodiment shown in FIG. 8.

Figure 9:
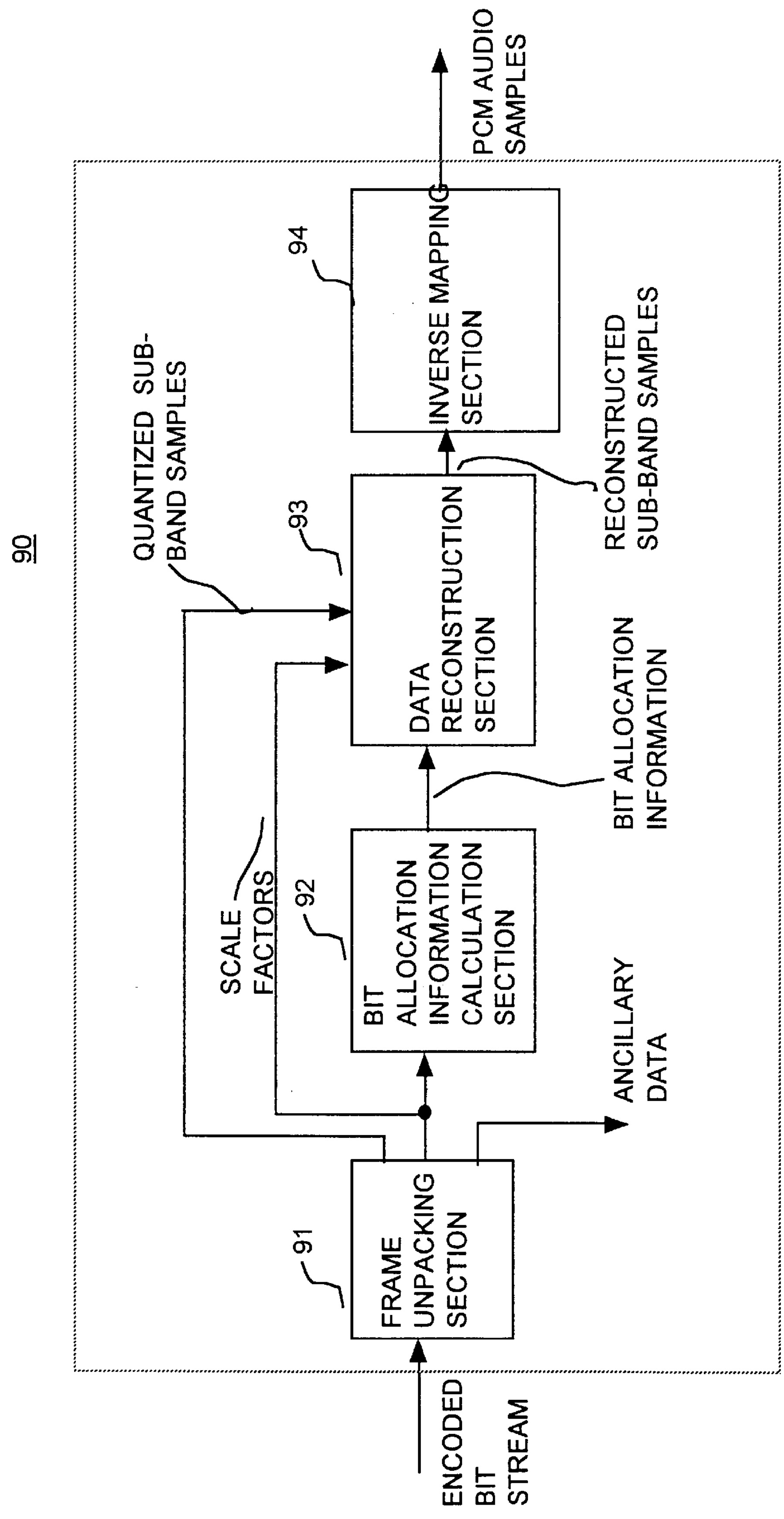
FIG. 9 is a general system block diagram of a first embodiment of an audio signal decoding apparatus according to the present invention.

A first embodiment of an audio signal decoding apparatus according to the present invention will be described referring to the general system block diagram of FIG. 9, which implements the first audio signal decoding method of FIG. 5 described hereinabove. The audio signal decoding apparatus of FIG. 9 is formed of a frame unpacking section 91 which receives an encoded bit-stream having the frame format shown in FIG. 2, a bit allocation information calculation section 92, a data reconstruction section 93 and an inverse mapping section 94. The frame unpacking section 91 analyzes each received frame to separate it into its various component portions shown in FIG. 2, i.e. header, error check data, scale factors, quantized sub-band samples, and ancillary data, and decodes and outputs these, with the scale factors being supplied to the bit allocation information calculation section 92 and to the data reconstruction section 93, and the quantized sub-band samples being supplied to the data reconstruction section 93.

The bit allocation information calculation section 92 uses the same algorithm as that used by the reconstruction stage 53 of the encoder embodiment of FIG. 6 to calculate the bit allocation information for that frame, based on the scale factors extracted from the frame. The data reconstruction section 93 utilizes this bit allocation information (i.e., information specifying, for each of the sub-bands, the number of quantization bits that has been used in quantizing each of the sub-band samples of that sub-band at the time of encoding) together with the respective scale factors of the sub-bands, to dequantize the sub-band samples conveyed by that frame. In the inverse mapping section 94, the inverse mapping process to that executed at the time of encoding is applied to the dequantized sub-band samples of each received frame, to recover the set of digital audio signal samples whose data are conveyed by that frame.

It can thus be understood that the encoder embodiment of FIG. 7 in combination with the decoder embodiment of FIG. 9 enables a digital audio signal encoding and decoding system for transmission of a digital audio signal as an encoded bitstream to be provided whereby encoded audio data are transmitted as a sequence of frames without the need to insert bit allocation information into each frame, thereby enabling a greater number of frame bits to be allocated for encoding audio data in each frame, and so enabling the frame length to be reduced and the overall delay that is incurred in the overall encoding and decoding process to be substantially reduced by comparison with the prior art, without changing the bit rate of the encoded data is stream, and without deterioration of audio reproduction quality.

Figure 10:
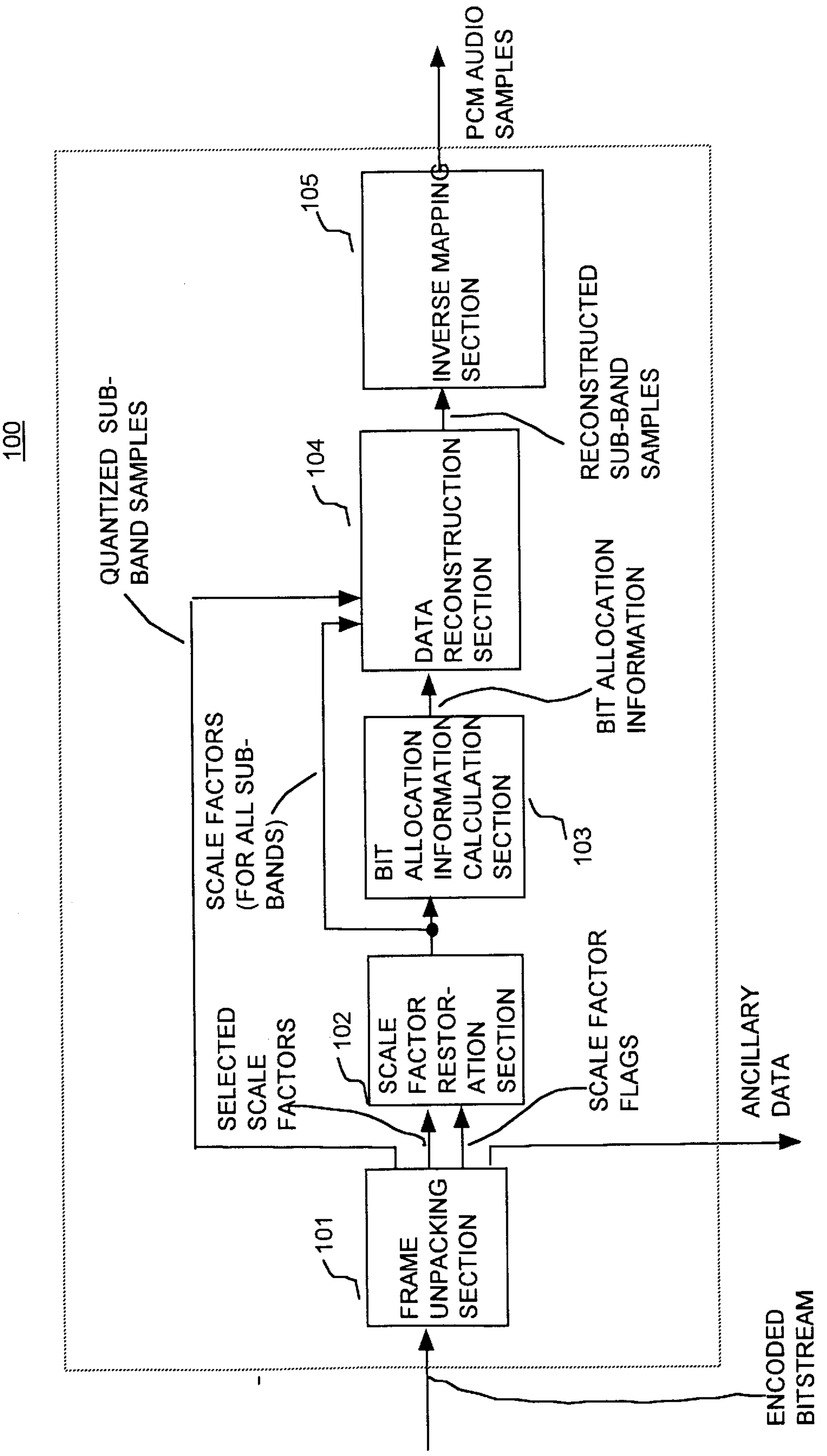
FIG. 10 is a general system block diagram of a second embodiment of an audio signal decoding apparatus according to the present invention.

A second embodiment of an audio signal decoding apparatus according to the present invention will be described referring to the general system block diagram of FIG. 10, which implements the second embodiment of an audio signal decoding method shown in FIG. 6 and described hereinabove. The audio signal decoding apparatus of FIG. 10 is formed of a frame unpacking section 101 which receives an encoded bitstream having the frame format shown in FIG. 4, a scale factor restoration section 102, a bit allocation information calculation section 103, a data reconstruction section 104 and an inverse mapping section 105. The frame unpacking section 101 analyzes each received frame to separate it into its various component portions shown in FIG. 4, i.e. header, error check data, scale factor flags, scale factors, quantized sub-band samples, and ancillary data, and decodes and outputs these, with the aforementioned selected scale factors being supplied to the scale factor restoration section 102 together with the scale factor flags for all of the sub-bands, and the quantized sub-band samples being supplied to the data reconstruction section 104.

Figure 12:
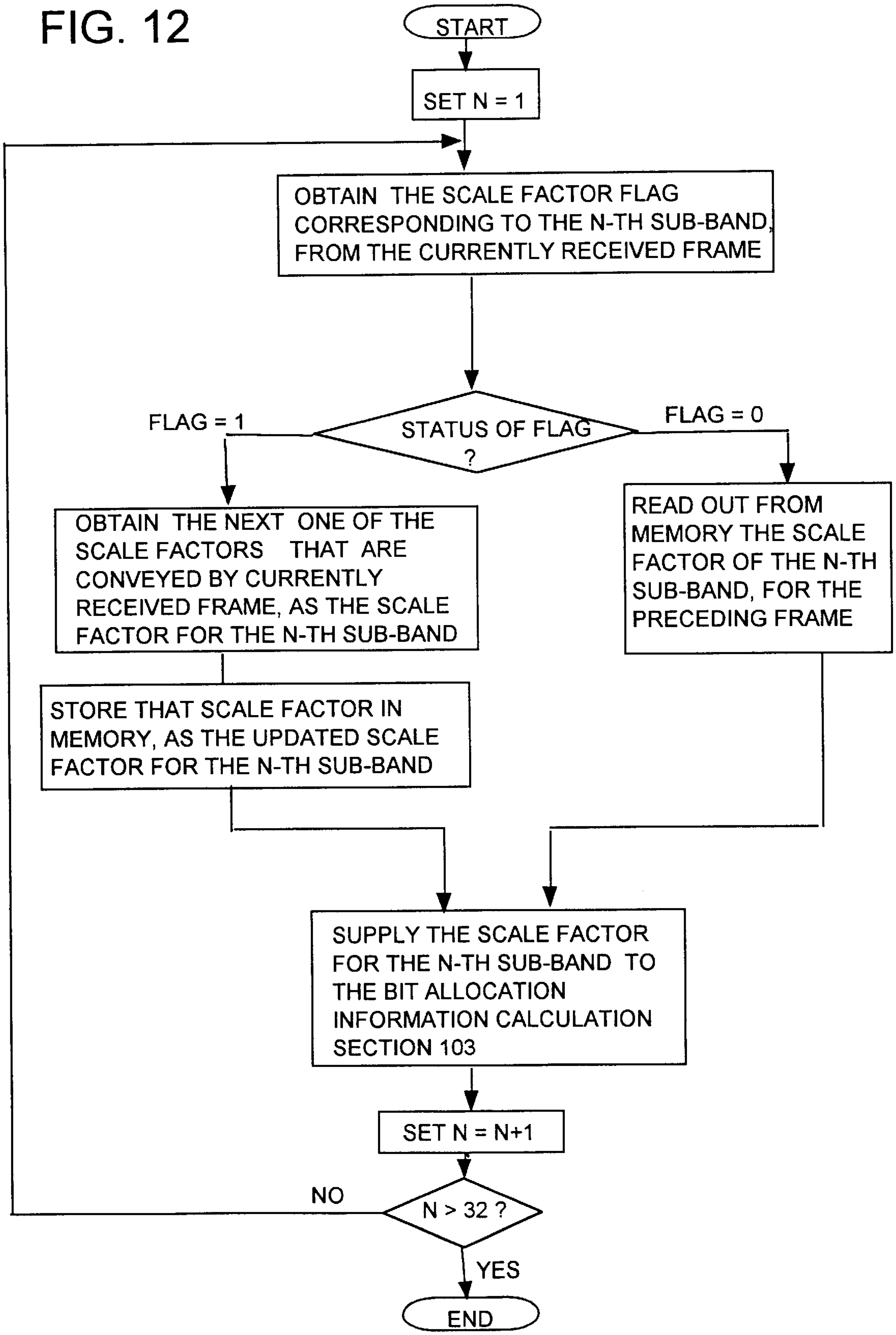
FIG. 12 is a flow diagram for illustrating processing which is executed by a scale factor restoration section in the audio signal decoding apparatus embodiment of FIG. 10.
Figure 13:
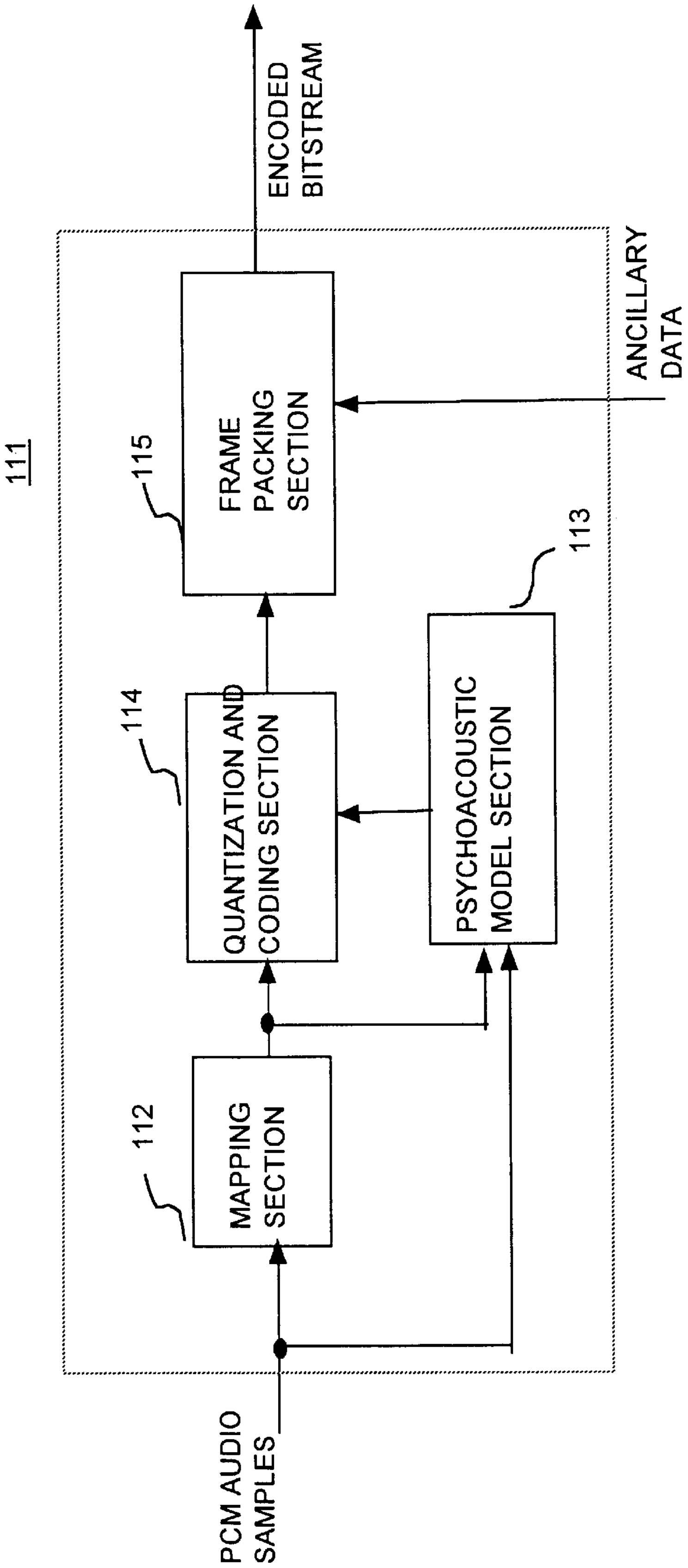
FIG. 13 PRIOR ART
FIG. 13 is a general system block diagram of an example of a prior art audio signal encoding apparatus.
Figure 14:
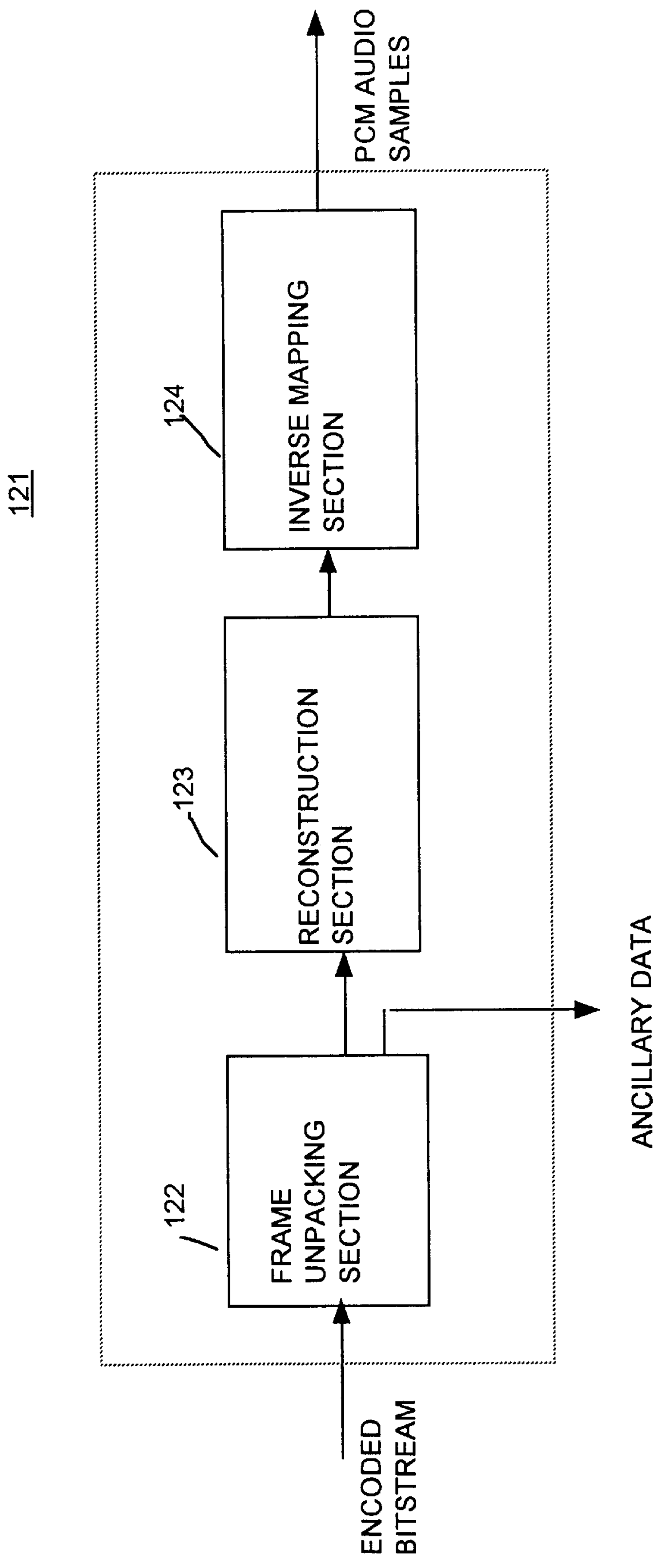
FIG. 14 PRIOR ART
FIG. 14 is a general system block diagram of an example of a prior art audio signal decoding apparatus.

The scale factor restoration section 102 serves to recover the complete set of scale factors for all of the sub-bands, for each received frame, based upon the states of the respective scale factor flags of these sub-bands. The scale factor restoration section 102 contains a memory (not shown in the drawing) having respective memory locations predetermined as corresponding to each of the sub-bands, and executes an algorithm of the form shown in the flow diagram of FIG. 12 (in which it is again assumed that the number of sub-bands is 32). As shown, the set of scale factors conveyed by a received frame are sequentially examined by the scale factor restoration section 102, in each iteration of the loop shown in FIG. 12. In each iteration, the scale factor restoration section 102 judges whether the scale factor of the corresponding sub-band of the immediately preceding frame is to be read out from memory and applied to the currently received frame, or if the next one of the sequence of scale factors conveyed by the received frame is to be utilized. In the latter case, the scale factor conveyed by the received frame is written into the memory location predetermined for the corresponding sub-band, updating the previous scale factor. In that way, the complete set of scale factors corresponding to the sub-bands is obtained, for each received frame, based upon the partial set of scale factors and on the scale factor flags which are conveyed by the frame.

The bit allocation information calculation section 103 uses the same algorithm as that used by the quantization section 85 of the encoder embodiment of FIG. 8 to calculate the bit allocation information for each received frame, based on the scale factors which are supplied from the scale factor restoration section 102. The data reconstruction section 104 utilizes this bit allocation information together with the respective scale factors of the sub-bands, to dequantize the sub-band samples conveyed by that frame. The dequantized sub-band samples are supplied to the inverse mapping section 105, which performs the inverse mapping processing to that of the mapping section 81 of the encoder apparatus of FIG. 10, to recover the set of digital audio signal samples whose data are conveyed by the received frame.

It can thus be understood that the encoder embodiment of FIG. 8 in combination with the decoder embodiment of FIG. 10 enables a digital audio signal encoding and decoding system for transmission of a digital audio signal as an encoded bitstream to be provided whereby encoded audio data are transmitted as a sequence of frames without the need to insert bit allocation information into each frame, as has been necessary in the prior art, and furthermore with only those scale factors being transmitted which are different from the scale factor of the corresponding sub-band in the preceding frame, thereby enabling a greater number of frame bits to be allocated for encoding audio data in each frame, and so enabling the frame length to be reduced and the overall delay that is incurred in the overall encoding and decoding process to be substantially reduced by comparison with the prior art, without requiring alteration of the bit rate at which the encoded data are transmitted and without deterioration of audio reproduction quality.

What is claimed is:

1. A method of encoding a digital audio signal to generate each of successive frames constituting an encoded bitstream by:

applying mapping processing to convert a set of data samples of said digital audio signal which are to be conveyed by one frame into a plurality of sets of sub-band samples, said plurality of sets corresponding to respective ones of a plurality of sub-bands, operating on said sets of sub-band samples to derive a plurality of scale factors respectively corresponding to said sub-bands, calculating respective sets of bit allocation information corresponding to each of said sub-bands, from said scale factors, quantizing each of said sets of sub-band samples in accordance with the bit allocation information and scale factor of the corresponding sub-band, and encoding said scale factors and quantized sub-band samples, and assembling said frame as a formatted bit sequence which includes respective sets of bits expressing said encoded scale factors and said encoded quantized sub-band samples, while excluding said bit allocation information.

2. A method of encoding a digital audio signal to generate each of successive frames constituting an encoded bitstream by:

applying mapping processing to convert a set of data samples of said digital audio signal which are to be conveyed by one frame into a plurality of sets of sub-band samples, said plurality of sets corresponding to respective ones of a plurality of sub-bands, operating on said sets of sub-band samples to calculate a plurality of scale factors respectively corresponding to said sub-bands, for each of said sub-bands, comparing said corresponding scale factor with a scale factor corresponding to said sub-band, of a preceding one of said frames, and when coincidence is detected as a result of said comparison, setting a scale factor flag which is predetermined as corresponding to said each sub-band to a first condition, while when non-coincidence is detected as a result of said comparison, setting said scale factor flag to a second condition, calculating respective sets of bit allocation information corresponding to each of said sub-bands, from said scale factors, for each of said sub-bands, quantizing the corresponding sub-band samples in accordance with the bit allocation information and the scale factor which have been calculated for said sub-band, and selecting each of said scale factors for which said coincidence was detected, encoding said selected scale factors and quantized sub-band samples, and assembling said each frame as a formatted bit sequence which includes respective sets of bits expressing said scale factor flags, said encoded selected scale factors, and said encoded quantized sub-band samples, while excluding said bit allocation information.

3. A method of decoding a digital audio signal which has been encoded as a formatted bitstream in accordance with said method of claim 1, wherein each of said frames constituting said encoded bitstream is decoded by:

separating said scale factors and said quantized sub-band samples from said frame, utilizing said scale factors to calculate said bit allocation information, utilizing said bit allocation information and said scale factors to dequantize said sub-band samples, applying inverse mapping processing to said dequantized sub-band samples, to recover a corresponding set of successive samples of said digital audio signal.

4. A method of decoding a digital audio signal which has been encoded as a formatted bitstream in accordance with said method of claim 2 wherein each of said frames constituting said encoded bitstream is decoded, as a current frame, by:

separating said scale factor flags, said selected scale factors and said quantized sub-band samples from said frame, successively judging each of said scale factor flags, and when said each scale factor flag is found to be in said first condition, specifying use of a scale factor of the sub-band corresponding to said scale factor flag, from a preceding one of said frames, while when said each scale factor flag is found to be in said second condition, specifying use of a corresponding one of said selected scale factors which is conveyed by said current frame, utilizing said specified scale factors to calculate said bit allocation information, utilizing said bit allocation information and said specified scale factors to dequantize said sub-band samples, and applying inverse mapping processing to said dequantized sub-band samples, to recover a corresponding set of successive samples of said digital audio signal.

5. An apparatus for encoding a digital audio signal as a sequence of frames constituting an encoded bitstream, comprising:

mapping means coupled to receive said digital audio signal, for applying a mapping operation to a set of samples of said digital audio signal which are to be conveyed by one frame, to obtain a plurality of sets of sub-band samples, said sets of sub-band samples corresponding to respective ones of a fixed plurality of sub-bands, scale factor calculation means for operating on said sets of sub-band samples to calculate a plurality of scale factors respectively corresponding to said sub-bands, bit allocation information calculation means for operating on said scale factors to calculate a plurality of sets of bit allocation information respectively corresponding to said sub-bands, quantization means for quantizing each of said sets of sub-band samples in accordance with the corresponding bit allocation information and scale factors, to obtain respective sets of quantized sub-band samples corresponding to said sub-bands, frame packing means for encoding said scale factors and quantized sub-band samples, and assembling said each frame as a formatted bit sequence which includes respective sets of bits expressing said encoded scale factors and said encoded quantized sub-band samples, while excluding said bit allocation information.

6. An apparatus for encoding a digital audio signal as a sequence of frames constituting an encoded bitstream, comprising:

mapping means coupled to receive said digital audio signal, for applying a mapping operation to a set of samples of said digital audio signal which are to be conveyed by one frame, to obtain a plurality of sets of sub-band samples, said sets of sub-band samples corresponding to respective ones of a fixed plurality of sub-bands, scale factor calculation means for operating on said sets of sub-band samples to calculate a plurality of scale factors respectively corresponding to said sub-bands, scale factor judgement means including memory means having a plurality of memory locations predetermined as respectively corresponding to said sub-bands, for comparing each of said scale factors of a frame with a corresponding scale factor which is stored in said memory and is of a preceding one of said frames, for setting a scale factor flag which is predetermined as corresponding to said each scale factor to a first condition when coincidence is detected as a result of said comparison, and for setting said scale factor flag to a second condition, selecting said each scale factor to be encoded, and writing said scale factor into the corresponding one of said memory locations, when non-coincidence is detected as a result of said comparison, bit allocation information calculation means coupled to receive said scale factors from said scale factor calculation means, for operating on said scale factors of said each frame to calculate sets of bit allocation information which correspond to respective ones of said sub-bands, quantization means for quantizing said set of sub-band samples corresponding to a frame, by utilizing for the sub-band samples corresponding to each of said sub-bands a corresponding one of said sets of bit allocation information, and frame packing means for encoding said ones of the scale factors which have been selected to be encoded, and encoding said quantized sub-band samples, and assembling said each frame as a formatted bit sequence which includes respective sets of bits expressing said scale factor flags, said encoded scale factors and said encoded quantized sub-band samples, while excluding said bit allocation information.

7. An apparatus for decoding a digital audio signal which has been encoded as an encoded bitstream formatted as a series of frames by an encoding apparatus in accordance with claim 5, comprising:

frame unpacking means for operating on each of said frames to separate said scale factors and said quantized sub-band samples from said each frame, bit allocation information calculation means coupled to receive said scale factors from said frame unpacking means, for operating on said scale factors of said each frame to calculate said bit allocation information, data reconstruction means coupled to receive said quantized samples and said bit allocation information of said each frame, for operating on said bit allocation information and said scale factors to recover a set of dequantized sub-band samples, inverse mapping means for applying inverse transform processing to said dequantized sub-band samples, to recover a set of successive samples of said digital audio signal.

8. An apparatus for decoding a digital audio signal which has been encoded as an encoded bitstream formatted as a series of frames by an encoding apparatus in accordance with claim 6, comprising:

frame unpacking means for operating on each of said frames to separate said scale factor flags, said selected scale factors and said quantized sub-band samples from said each frame, scale factor restoration means including memory means having a plurality of memory locations predetermined as respectively corresponding to said sub-bands, coupled to receive said scale factor flags and said selected scale factors of said each frame, for judging the condition of each of said scale factor flags and when scale factor flag is judged to be in said first condition, reading out a scale factor from a memory location corresponding to the sub-band of said scale factor flag, and outputting said scale factor, while when said scale factor flag is judged to be in said second condition, outputting the corresponding one of said selected scale factors conveyed by said each frame, and writing said corresponding one of the selected scale factors into said memory location, bit allocation information calculation means coupled to receive said scale factors produced from scale factor restoration means, for operating on said scale factors of said each frame to calculate said bit allocation information, data reconstruction means coupled to receive said quantized samples and said bit allocation information of said each frame, for operating on said bit allocation information and said scale factors to recover a set of dequantized sub-band samples, and inverse mapping means for applying inverse transform processing to said dequantized sub-band samples, to recover a set of successive samples of said digital audio signal.

9. An encoding and decoding system for transmitting a digital audio signal as an encoded bitstream, comprising in combination:

a digital audio signal encoding apparatus having mapping means coupled to receive said digital audio signal, for applying a mapping operation to a set of samples of said digital audio signal which are to be conveyed by one frame, to obtain a plurality of sets of sub-band samples, said sets of sub-band samples corresponding to respective ones of a fixed plurality of sub-bands, scale factor calculation means for operating on said sets of sub-band samples to calculate a plurality of scale factors respectively corresponding to said sub-bands, bit allocation information calculation means for operating on said scale factors to calculate a plurality of sets of bit allocation information respectively corresponding to said sub-bands, quantization means for quantizing each of said sets of sub-band samples in accordance with the corresponding bit allocation information and scale factors, to obtain respective sets of quantized sub-band samples corresponding to said sub-bands, frame packing means for encoding said scale factors and quantized sub-band samples, and assembling said each frame as a formatted bit sequence which includes respective sets of bits expressing said encoded scale factors and said encoded quantized sub-band samples, while excluding said bit allocation information; and a digital audio signal decoding apparatus having frame unpacking means for operating on each of said frames to separate said scale factors and said quantized sub-band samples from said each frame, bit allocation information calculation means coupled to receive said scale factors from said frame unpacking means, for operating on said scale factors of said each frame to calculate said bit allocation information, data reconstruction means coupled to receive said quantized samples and said bit allocation information of said each frame, for operating on said bit allocation information and said scale factors to recover a set of dequantized sub-band samples, inverse mapping means for applying inverse transform processing to said dequantized sub-band samples, to recover a set of successive samples of said digital audio signal.

10. An encoding and decoding system for transmitting a digital audio signal as an encoded bitstream, comprising in combination a digital audio signal encoding apparatus having mapping means coupled to receive said digital audio signal, for applying a mapping operation to a set of samples of said digital audio signal which are to be conveyed by one frame, to obtain a plurality of sets of sub-band samples, said sets of sub-band samples corresponding to respective ones of a fixed plurality of sub-bands, scale factor calculation means for operating on said sets of sub-band samples to calculate a plurality of scale factors respectively corresponding to said sub-bands, scale factor judgement means including memory means having a plurality of memory locations predetermined as respectively corresponding to said sub-bands, for comparing each of said scale factors of a frame with a corresponding scale factor which is stored in said memory and is of a preceding one of said frames, for setting a scale factor flag which is predetermined as corresponding to said each scale factor to a first condition when coincidence is detected as a result of said comparison, and for setting said scale factor flag to a second condition, selecting said each scale factor to be encoded, and writing said scale factor into the corresponding one of said memory locations, when non-coincidence is detected as a result of said comparison, bit allocation information calculation means coupled to receive said scale factors from said scale factor calculation means, for operating on said scale factors of said each frame to calculate sets of bit allocation information which correspond to respective ones of said sub-bands, quantization means for quantizing said set of sub-band samples corresponding to a frame, by utilizing for the sub-band samples corresponding to each of said sub-bands a corresponding one of said sets of bit allocation information, and frame packing means for encoding said ones of the scale factors which have been selected to be encoded, and encoding said quantized sub-band samples, and assembling said each frame as a formatted bit sequence which includes respective sets of bits expressing said scale factor flags, said encoded scale factors and said encoded quantized sub-band samples, while excluding said bit allocation information; and a digital audio signal decoding apparatus having frame unpacking means for operating on each of said frames to separate said scale factor flags, said selected scale factors and said quantized sub-band samples from said each frame, scale factor restoration means including memory means having a plurality of memory locations predetermined as respectively corresponding to said sub-bands, coupled to receive said scale factor flags and said selected scale factors of said each frame, for judging the condition of each of said scale factor flags and when scale factor flag is judged to be in said first condition, reading out a scale factor from a memory location corresponding to the sub-band of said scale factor flag, and outputting said scale factor, while when said scale factor flag is judged to be in said second condition, outputting the corresponding one of said selected scale factors conveyed by said each frame, and writing said corresponding one of the selected scale factors into said memory location, bit allocation information calculation means coupled to receive said scale factors produced from scale factor restoration means, for operating on said scale factors of said each frame to calculate said bit allocation information, data reconstruction means coupled to receive said quantized samples and said bit allocation information of said each frame, for operating on said bit allocation information and said scale factors to recover a set of dequantized sub-band samples, and inverse mapping means for applying inverse transform processing to said dequantized sub-band samples, to recover a set of successive samples of said digital audio signal.

* * * * *